(12) United States Patent
Masui et al.

(10) Patent No.: US 7,965,750 B2
(45) Date of Patent: Jun. 21, 2011

(54) SEMICONDUCTOR LIGHT EMITTING DEVICE

(75) Inventors: Yuji Masui, Kanagawa (JP); Takahiro Arakida, Kanagawa (JP); Yoshinori Yamauchi, Tokyo (JP); Rintaro Koda, Tokyo (JP); Tomoyuki Oki, Miyagi (JP); Naoki Jogan, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/385,811

(22) Filed: Apr. 21, 2009

(65) Prior Publication Data

US 2009/0285253 A1    Nov. 19, 2009

(30) Foreign Application Priority Data

May 14, 2008    (JP) ................. P2008-126665

(51) Int. Cl.
*H01S 5/00* (2006.01)
*H01S 3/094* (2006.01)
(52) U.S. Cl. ................. 372/45.01; 372/50.1; 372/75
(58) Field of Classification Search .......... 372/45.01, 372/75, 50, 50.1
See application file for complete search history.

(56) References Cited

U.S. PATENT DOCUMENTS

| 5,594,751 A * | 1/1997 | Scott ................ 372/46.013 |
| 2002/0146053 A1 * | 10/2002 | Iwai .................. 372/75 |
| 2007/0071054 A1 * | 3/2007 | Takahashi ........... 372/50.1 |

FOREIGN PATENT DOCUMENTS

| JP | 05-190974 A | 7/1993 |
| JP | 05-251739 A | 9/1993 |
| JP | 07-115244 A | 5/1995 |
| JP | 2000-223791 A | 8/2000 |
| JP | 2000-232255 A | 8/2000 |
| JP | 2000-332355 | 11/2000 |
| JP | 2002-204026 A | 7/2002 |
| JP | 2004-103754 A | 4/2004 |
| JP | 2004-146833 A | 5/2004 |
| JP | 2005-085836 A | 3/2005 |
| JP | 2005-209950 A | 8/2005 |

(Continued)

OTHER PUBLICATIONS

Japanese Office Action issued Feb. 16, 2010 for corresponding Japanese Application No. 2008-126665.

(Continued)

*Primary Examiner* — Minsun Harvey
*Assistant Examiner* — Patrick Stafford
(74) *Attorney, Agent, or Firm* — Rader, Fishman & Grauer PLLC

(57) ABSTRACT

A semiconductor light emitting device includes a first-conductivity-type first multilayer film reflecting mirror, and a second-conductivity-type second multilayer film reflecting mirror; a cavity layer; and a first conductive section, a second conductive section, and a third conductive section. The cavity layer has a stacked configuration including a first-conductivity-type or undoped first cladding layer, an undoped first active layer, a second-conductivity-type or undoped second cladding layer, a second-conductivity-type first contact layer, a first-conductivity-type second contact layer, a first-conductivity-type or undoped third cladding layer, an undoped second active layer, and a second-conductivity-type or undoped fourth cladding layer. The first conductive section is electrically connected to the first multilayer film reflecting mirror, the second conductive section is electrically connected to the second multilayer film reflecting mirror, and the third conductive section is electrically connected to the first contact layer and the second contact layer.

18 Claims, 24 Drawing Sheets

FOREIGN PATENT DOCUMENTS

| | | | |
|---|---|---|---|
| JP | 2006-019679 | A | 1/2006 |
| JP | 2006-351798 | A | 12/2006 |
| JP | 2007-227860 | | 9/2007 |
| JP | 2007227860 | A * | 9/2007 |
| JP | 2008-085301 | A | 4/2008 |

OTHER PUBLICATIONS

Japanese Office Action issued Sep. 29, 2010 for corresponding Japanese Application No. 2008-126665.

* cited by examiner

SEMICONDUCTOR LIGHT EMITTING DEVICE

BACKGROUND OF THE INVENTION

1. Field of the Invention

The present invention relates to a semiconductor light emitting device emitting laser light in a stacking direction, and particularly relates to the semiconductor light emitting device suitably used in an application in which a large light output is desired.

2. Description of the Related Art

A vertical cavity surface emitting laser (VCSEL) differs from an edge emitting laser diode in that the VCSEL emits light in a direction orthogonal to a substrate, and allows multiple devices to be arranged in a two-dimensional array on the same substrate. Thus, the VCSEL has attracted attention in the data-communication field in recent years.

A typical VCSEL includes, for example, a pair of n-type multilayer film reflecting mirror and p-type multilayer film reflecting mirror, and a cavity layer arranged between the pair of n-type multilayer film reflecting mirror and p-type multilayer film reflecting mirror on an n-type semiconductor substrate. The cavity layer includes an n-type cladding layer, an active layer including a light emitting region, a p-type cladding layer, and a current confinement layer in this order from the n-type multilayer film reflecting mirror side. The current confinement layer has an annular current confining region confining a current injecting region. The current confinement layer functions to improve current injection efficiency to the active layer, and to reduce threshold current. The pair of n-type multilayer film reflecting mirror and p-type multilayer film reflecting mirror have the configuration in which a low-refractive index layer and a high-refractive index layer with an optical film thickness of $\lambda/4$ ($\lambda$ is a emission wavelength) are stacked alternately. The VCSEL is provided with an n-side electrode on a rear surface side, and a p-side electrode on a top surface side. The p-side electrode includes an aperture for emitting light from the light emitting region. In the VCSEL, current confined with the current confinement layer is injected to the active layer, and light generated in the active layer is reflected and amplified with the pair of n-type multilayer film reflecting mirror and p-type multilayer film reflecting mirror. As a result, the light is emitted from the aperture arranged in the p-side electrode.

In the above-mentioned VCSEL, the active layer is approximately a couple of tens of nm in thickness, and the light emitting region in the active layer is approximately 10 μm in diameter. The volume of the light emitting region in the VCSEL is much smaller than that of the light emitting region in an edge emitting laser diode. Thus, when the amount of current injected to the light emitting region increases, a light output is immediately saturated due to heat locally generated in the light emitting region. Therefore, simply increasing the amount of injected current does not contribute to increasing the light output. To avoid the immediate saturation of the light output, it is considered that an inner diameter of the current confining region in the current confinement layer (current confining diameter) is set larger so that the area (volume) of the light emitting region becomes larger. However, when the area of the light emitting region becomes large, multi-mode oscillation which destabilizes a distribution in the lateral direction of the light output is generated, and this leads to an issue that FFP (far field pattern) becomes unstable. Alternatively, it is considered that the area of the light emitting region is left as it is, and the thickness of the active layer is increased. For example, the active layer is configured with multiple quantum wells, and the active layer is thickened by increasing the stacking number of the quantum wells. However, when thickening the active layer in this way, current injection efficiency of each quantum well is reduced, and the threshold current is increased. Accordingly, there is an issue that even if the active layer is thickened, the light output is not so increased.

It is also considered that two active layers are provided within a cavity, and current is separately injected to each of the active layers. Thereby, without changing the amount of current injected to the active layer, the current confining diameter, or the thickness of the active layer, the thickness of the active layer as seen from the whole VCSEL may be increased. Therefore, the light output may increase while FFP is stabilized. For example, Japanese Unexamined Patent Publication No. 2007-227860 discloses a following technique. Between a pair of p-type multilayer film reflecting mirror and an n-type multilayer film reflecting mirror, a PIN structure by stacking a p-type current confinement layer, a p-type cladding layer, an active layer, and an n-type cladding layer in this order from the p-type multilayer film reflecting mirror side, and a PIN structure by stacking an n-type cladding layer, an active layer, a p-type cladding layer, and a p-type current confinement layer in this order from the n-type multilayer film reflecting mirror side are provided. Moreover, an n-type contact layer is provided between these PIN structures. An electrode electrically connected to this n-type contact layer is regarded as a common electrode for both of the PIN structures, and current is injected in parallel from the common electrode to the two active layers. Thereby, current is separately injected to the two active layers.

SUMMARY OF THE INVENTION

However, in terms of current control, it is difficult to drive the two active layers in parallel. In the case where the two active layers are driven in parallel with one laser diode driver, when electric properties of the two active layers are varied, a larger amount of current flows to one of the active layers due to the variation of the electric properties. In that situation, it is not easy to equalize the magnitude of the current flowing to the two active layers. For this reason, it is considered that the common electrode is not used, and a laser diode driver is prepared for each of the active layers to separately drive the active layers. However, in that case, the cost goes up with the increasing number of the laser diode drivers.

In view of the foregoing, it is desirable to provide a semiconductor light emitting device capable of increasing light output while FFP is stabilized, and easily controlling current with one driver.

According to an embodiment of the present invention, there is provided a semiconductor light emitting device including: a first-conductivity-type first multilayer film reflecting mirror, and a second-conductivity-type second multilayer film reflecting mirror; a cavity layer arranged between the first multilayer film reflecting mirror and the second multilayer film reflecting mirror; and a first conductive section, a second conductive section, and a third conductive section used for current injection to the cavity layer. The cavity layer has a stacked configuration including a first-conductivity-type or undoped first cladding layer, an undoped first active layer, a second-conductivity-type or undoped second cladding layer, a second-conductivity-type first contact layer, a first-conductivity-type second contact layer, a first-conductivity-type or undoped third cladding layer, an undoped second active layer, and a second-conductivity-type or undoped fourth cladding layer in this order from the first multilayer film reflecting mirror side. The first conductive section is electrically connected to the first multilayer film reflecting mirror, the second conductive section is electrically connected to the second multilayer film reflecting mirror, and the third conductive section is electrically connected to the first contact layer and the second contact layer.

In the semiconductor light emitting device according to the embodiment of the present invention, the cavity layer is formed by stacking a first stacked structure and a second stacked structure with each other with the third conductive section in between, the first stacked structure including the first multilayer film reflecting mirror, the first cladding layer, the first active layer, the second cladding layer, and the first contact layer in this order, and the second staked structure including the second contact layer, the third cladding layer, the second active layer, the fourth cladding layer in this order. Thereby, it is possible that that the two active layers (the first active layer and the second active layer) are electrically connected in series between the first conductive section and the second conductive section.

According to the semiconductor light emitting device of the embodiment of the present invention, the cavity layer is formed by stacking a first stacked structure and a second stacked structure with each other with the third conductive section in between, the first stacked structure including the first multilayer film reflecting mirror, the first cladding layer, the first active layer, the second cladding layer, and the first contact layer in this order, and the second staked structure including the second contact layer, the third cladding layer, the second active layer, the fourth cladding layer in this order. Thereby, it is possible that that the two active layers (the first active layer and the second active layer) are electrically connected in series between the first conductive section and the second conductive section. Therefore, since current is injected in series from the first conductive section and the second conductive section to the two active layers, it is possible that current with magnitude similar to each other flows to both of the active layers. As a result, even if the electric properties of each of the active layers are varied, the current may be easily controlled with one driver. Since the current separately flows to the two active layers arranged within the cavity layer, the light output may increase while FFP is in stable condition.

Other and further objects, features and advantages of the invention will appear more fully from the following description.

DETAILED DESCRIPTION OF THE PREFERRED EMBODIMENTS

Preferred embodiments of the present invention will be described in detail with reference to the accompanying drawings.

First Embodiment

Figure 1:
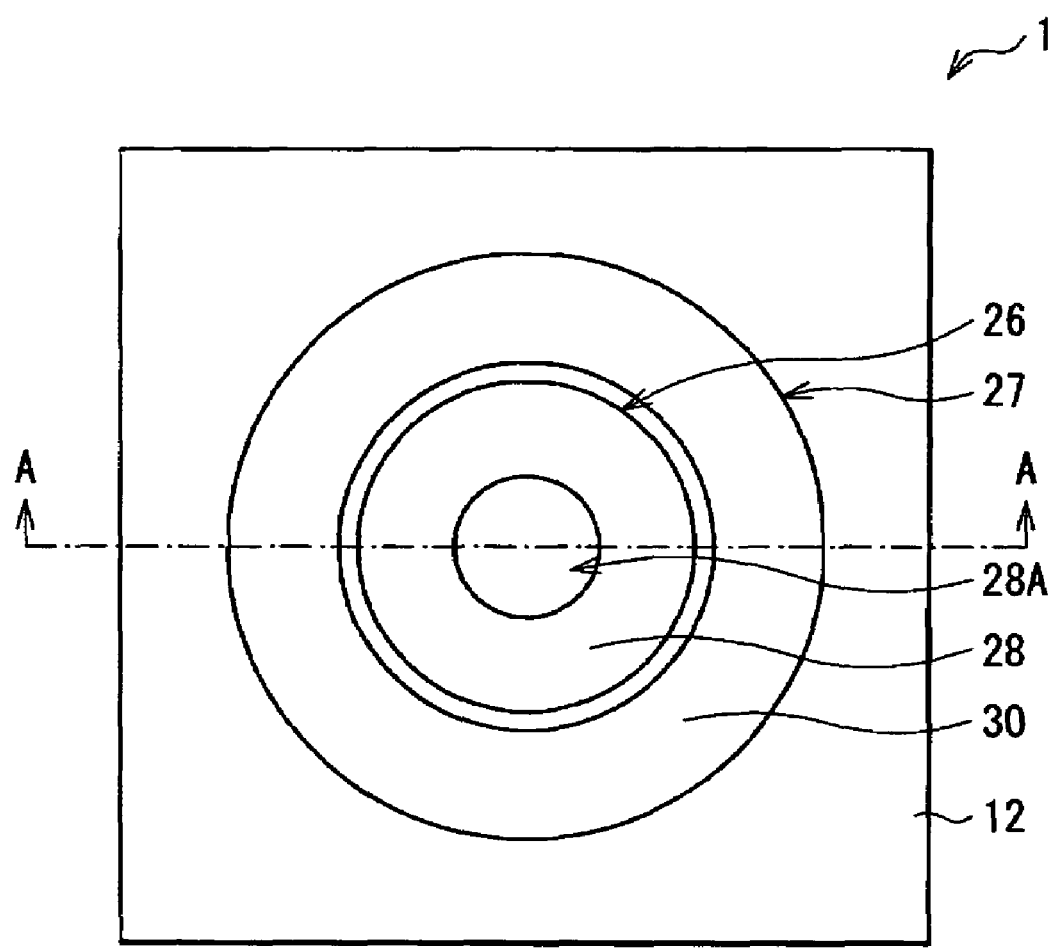
FIG. 1 is a top view of a laser diode according to a first embodiment of the present invention.
Figure 2:
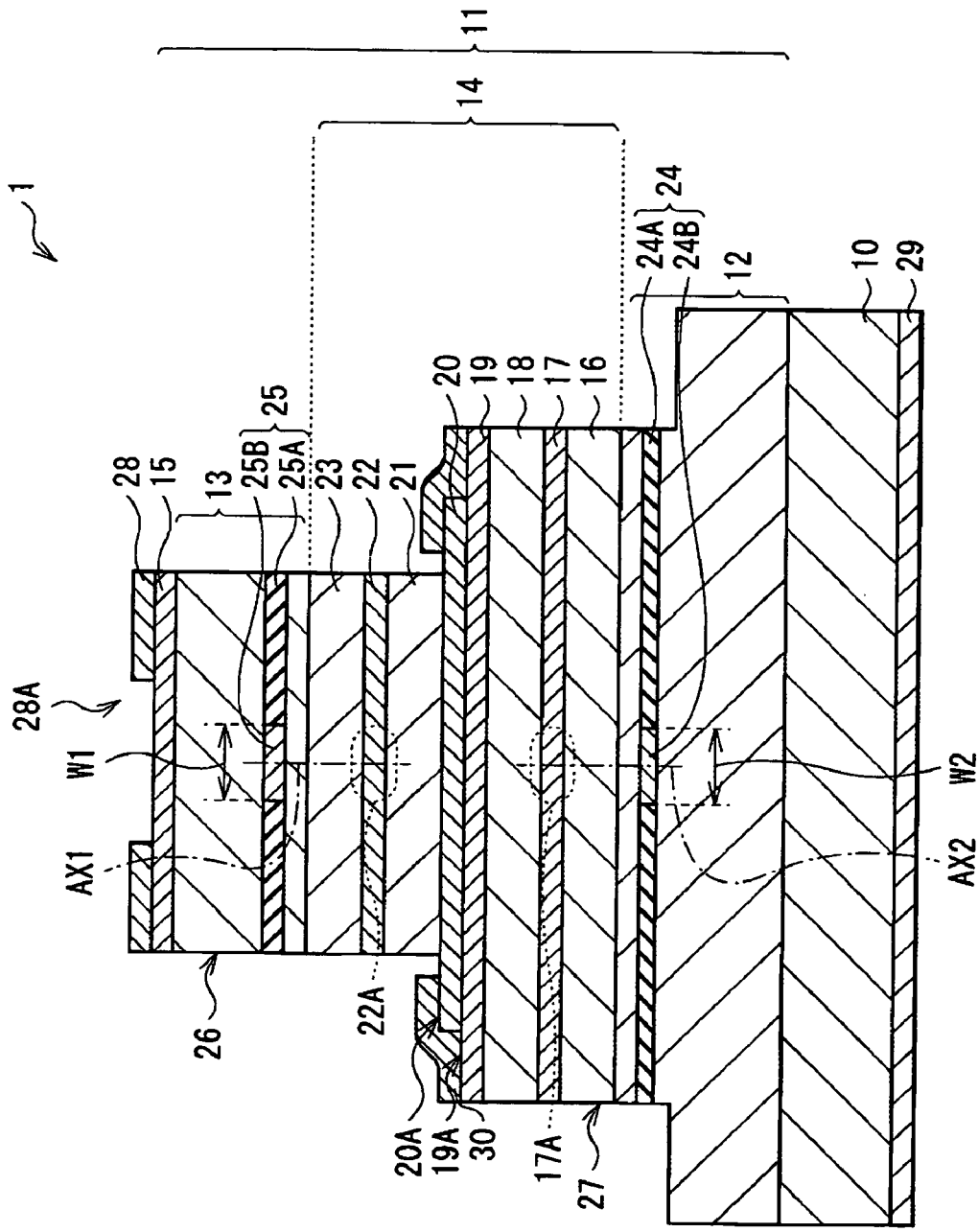
FIG. 2 is a cross-sectional view illustrating an example of the configuration in a direction of arrow A-A of the laser diode of FIG. 1.
Figure 3:
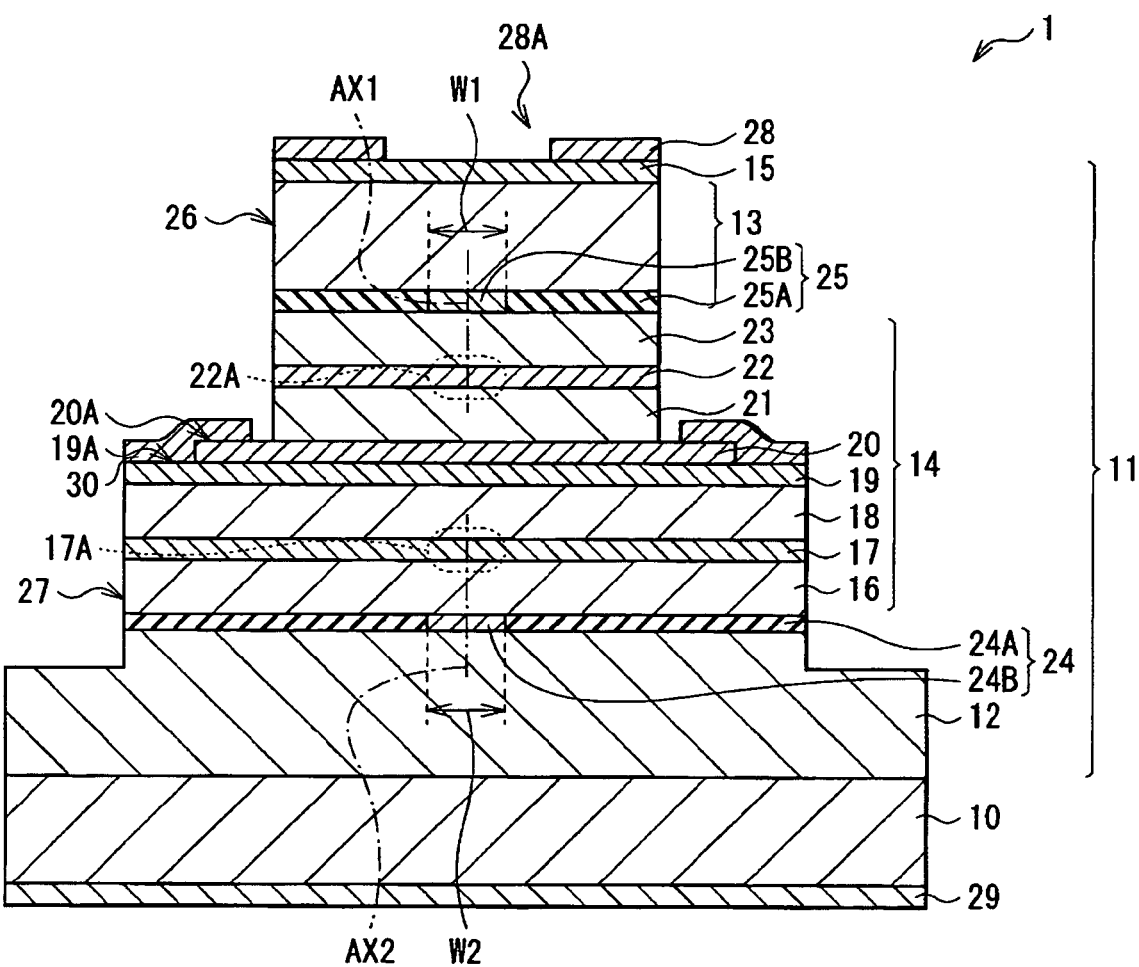
FIG. 3 is a cross-sectional view illustrating another example of the configuration in the direction of arrow A-A of the laser diode of FIG. 1.

FIG. 1 illustrates an example of a top view of a laser diode 1 according to a first embodiment of the present invention. FIG. 2 illustrates an example of the cross-sectional configuration in a direction of arrow A-A of the laser diode 1 of FIG. 1. FIG. 3 illustrates another example of the cross-sectional configuration in the direction of arrow A-A of the laser diode 1 of FIG. 1.

The laser diode 1 according to the first embodiment is a light emitting laser diode which emits light in a stacking direction, and includes a stacked structure 11 on one surface side of an n-type semiconductor substrate 10. The stacked structure 11 includes a pair of resonator mirrors of an n-type DBR layer 12 (first-conductivity-type first multilayer film reflecting mirror) on the n-type semiconductor substrate 10 side, and a p-type DBR layer 13 (second-conductivity-type second multilayer film reflecting mirror) on the side opposite from the n-type semiconductor substrate 10. Between the n-type DBR layer 12 and the p-type DBR layer 13, a cavity layer 14 is provided. On the opposite side of the p-type DBR layer 13 from the n-type semiconductor substrate 10, a contact layer 15 is provided.

The cavity layer 14 has the configuration in which an n-type or undoped cladding layer 16 (first cladding layer), an undoped active layer 17 (first active layer), a p-type or undoped cladding layer 18 (second cladding layer), a p-type contact layer 19 (first contact layer), an n-type contact layer 20 (second contact layer), an n-type or undoped cladding layer 21 (third cladding layer), an undoped active layer 22 (second active layer), and a p-type or undoped cladding layer 23 (fourth cladding layer) are stacked in this order from the n-type DBR layer 12 side.

An n-type current confinement layer 24 (first current confinement layer), and p-type current confinement layer 25 (second current confinement layer) are provided outside the cavity layer 14. As illustrated in FIGS. 2 and 3, the n-type current confinement layer 24 is provided within the n-type DBR layer 12, or between the n-type DBR layer 12 and the cladding layer 16. As illustrated in FIGS. 2 and 3, the p-type current confinement layer 25 is provided within the p-type DBR layer 13, or between the p-type DBR layer 13 and the cladding layer 23. That is, in the first embodiment, the n-type current confinement layer 24 and the p-type current confinement layer 25 are provided in a position where a cavity length is unvaried between the case in which the n-type current confinement layer 24 and the p-type current confinement layer 25 are provided, and the case in which these layers are not provided.

In the stacked structure 11, a PIN structure is formed with the n-type DBR layer 12, the cladding layer 16, the active layer 17, the cladding layer 18, and the p-type contact layer 19. Moreover, a PIN structure is formed with the n-type contact layer 20, the cladding layer 21, the active layer 22, the cladding layer 23, and the p-type DBR layer 13. That is, in the first embodiment, the two PIN structures are stacked in the stacked structure 11 (in the cavity layer 14), while an n-type semiconductor layer (n-type contact layer 20) in one of the PIN structures, and a p-type semiconductor layer (n-type contact layer 19) in the other of the PIN structures are brought into contact with each other.

In the upper part of the stacked structure 11, specifically, with the cladding layer 21, the active layer 22, the cladding layer 23, the p-type DBR layer 13, and the p-type contact layer 15, a columnar mesa 26 is formed. In the lower part of the stacked structure 11, specifically, with the upper part of the n-type DBR layer 12, the cladding layer 16, the active layer 17, the cladding layer 18, the p-type contact layer 19, and the n-type contact layer 20, a columnar mesa 27 having a diameter equal to or larger than that of the mesa 26 is formed. In the case where the diameter of the mesa 27 is larger than that of the mesa 26, as illustrated in FIG. 2, an outer edge of an upper surface of the mesa 27 is exposed from the side face of the cavity layer 14, and is a ring-shaped planarized face which is approximately parallel to the stacked face. Moreover, the side face of the cavity layer 14 has a stepped shape.

From the bottom face of the cladding layer 21 to the upper surface of the p-type contact layer 15, the mesa 26 has a column shape with a central axis AX1 in the stacking direction. The side face (peripheral face) of the mesa 26 is a vertical face vertically (or almost vertically) intersecting the stacked face, and the side face of the p-type current confinement layer 25 is exposed to the vertical face.

From the upper part of the n-type DBR layer 12 to the upper surface of the n-type contact layer 20, the mesa 27 has a column shape with a central axis AX2 in the stacking direction. The side face (peripheral face) of the mesa 27 is a vertical face vertically (or almost vertically) intersecting the stacked face, and the side face of the n-type current confinement layer 24 is exposed to the vertical face.

In the case where the diameter of the mesa 27 is approximately equal to that of the mesa 26, the side faces of the p-type contact layer 19 and the n-type contact layer 20 are exposed to the side face of the mesa 27. In the case where the diameter of the mesa 27 is larger than that of the mesa 26, it is not only that the side faces of the p-type contact layer 19 and the n-type contact layer 20 are exposed to the side face of the mesa 27, but also that the upper surface of the p-type contact layer 19 and the upper surface of the n-type contact layer 20 are partially exposed to the outer edge of the upper surface of the mesa 27 (bottom of the mesa 26). Both of an exposed face 19A (first exposed face) exposed to the side face and the upper surface of the mesa 27 in the p-type contact layer 19, and an exposed face 20A (second exposed face) exposed to the side face and the upper surface of the mesa 27 in the n-type contact layer 20 are ring-shaped, and the exposed face 20A is formed on the inner periphery side of the exposed face 19A.

Figure 4:
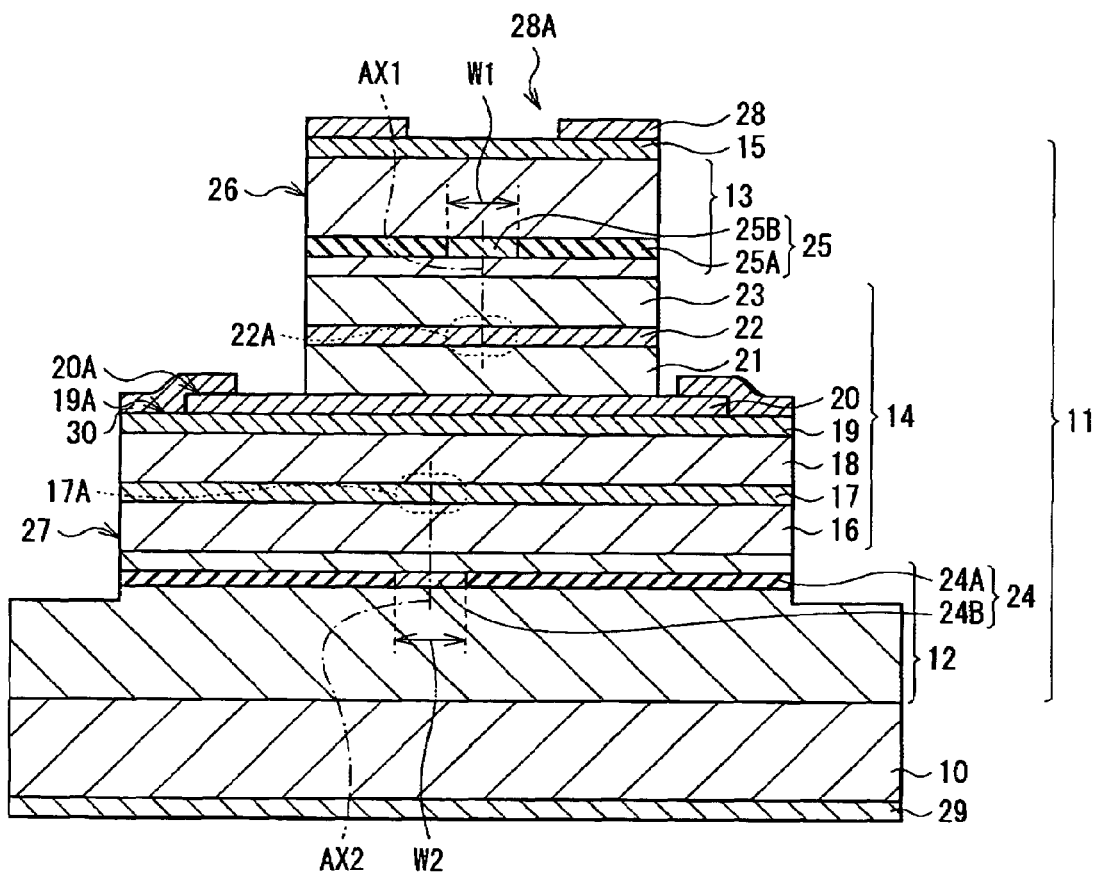
FIG. 4 is a cross-sectional view illustrating still another example of the configuration in the direction of arrow A-A of the laser diode of FIG. 1.

In the case where the number of light outputs (light emitting spots) from the laser diode 1 is one, as illustrated in FIGS. 2 and 3, it is preferable that the central axis AX1 of the mesa 26 (central axis of a current injecting region 25B which will be described later) overlap with the central axis AX2 of the mesa 27 (central axis of a current injecting region 24B which will be described later). In the case where the light output (light emitting spot) from the laser diode 1 is widened, or the number of the light outputs is two, as illustrated in FIG. 4, it is preferable that the central axis AX1 of the mesa 26 (central axis of the current injecting region 25B) be shifted from the central axis AX2 of the mesa 27 (central axis of the current injecting region 24B).

Here, the n-type semiconductor substrate 10 is made of, for example, n-type GaAs. The n-type DBR layer 12 has the configuration in which a low-refractive index layer (not illustrated in the figure) and a high-refractive index layer (not illustrated in the figure) are stacked alternately. For example, the low-refractive index layer is made of n-type $Al_{x1}Ga_{1-x1}As$ ($0<x1<1$) having an optical thickness of $\lambda_1/4$ ($\lambda_1$ is an oscillation wavelength), and the high-refractive index layer is made of n-type $Al_{x2}Ga_{1-x2}As$ ($0 \leqq x2 \leqq 1$) having an optical thickness of $\lambda_1/4$. As the n-type impurities, for example, there are silicon (Si) and selenium (Se). The p-type DBR layer 13 has the configuration in which a low-refractive index layer (not illustrated in the figure) and a high-refractive index layer (not illustrated in the figure) are alternately stacked. For example, the low-refractive index layer is made of p-type $Al_{x3}Ga_{1-x3}As$ ($0<x3<1$) having an optical thickness of $\lambda_1/4$, and the high-refractive index layer is made of p-type $Al_{x4}Ga_{1-x4}As$ ($0 \leqq x4 < x3$) having an optical thickness of $\lambda_1/4$. As the p-type impurities, for example, there are carbon (C), zinc (Zn), magnesium (Mg), and beryllium (Be). The p-type contact layer 15 is made of, for example, p-type AlGaAs, and contains p-type impurities in high concentration.

The cladding layer 16 is made of, for example, n-type or undoped AlGaAs. The active layer 17 is made of, for example, undoped GaAs material. In the active layer 17, the central part in the stacked plane direction (region facing the current injecting region 24B which will be described later) is a light emitting region 17A. The cladding layer 18 is made of, for example, p-type or undoped AlGaAs. The p-type contact layer 19 is made of, for example, p-type AlGaAs, and contains p-type impurities in high concentration.

The n-type contact layer 20 is made of, for example, n-type AlGaAs, and contains n-type impurities in high concentration. The cladding layer 21 is made of, for example, n-type or undoped AlGaAs. The active layer 22 is made of, for example, undoped GaAs material. In the active layer 22, the central part in the stacked plane direction (region facing the current injecting region 25B which will be described later) is a light emitting region 22A. The cladding layer 23 is made of, for example, p-type or undoped AlGaAs.

The active layers 17 and 22 may have band gaps equal to each other (for example, band gaps which correspond to an oscillation wavelength $\lambda_1$), or may have band gaps different from each other. However, in the case where the active layers 17 and 22 have band gaps different from each other, it is necessary that the band gaps of the active layers 17 and 22 correspond to a wavelength within a region where the n-type DBR layer 12 and the p-type DBR layer 13 function as reflecting mirrors with respect to a wavelength of light emitted from the active layers 17 and 22.

Figure 5:
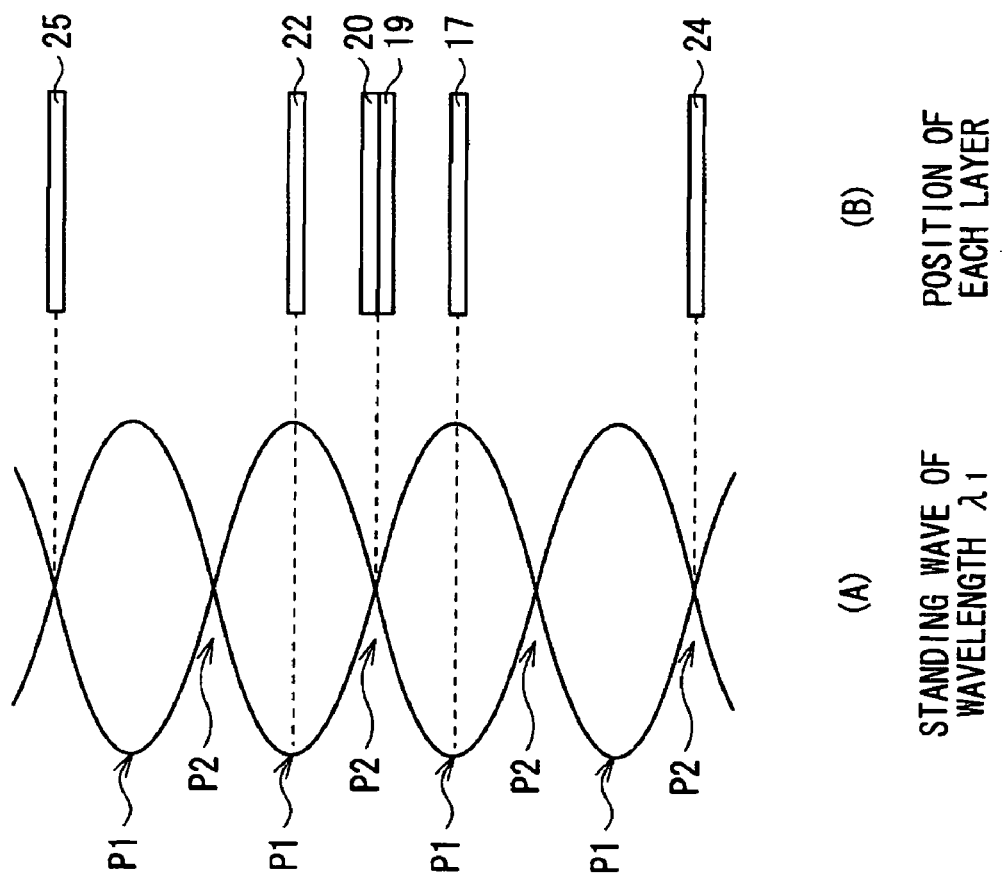
FIG. 5 is a schematic view for explaining an example of a positional relationship between an active layer and a standing wave of FIG. 1.

Here, in the case where the active layers 17 and 22 have band gaps equal to each other, for example, as illustrated in FIG. 5, a standing wave which has a single wavelength $\lambda_1$ corresponding to the band gaps of the active layers 17 and 22 is generated in the stacked structure 11 (in the cavity layer 14). In that case, as illustrated in FIG. 5, the active layers 17 and 22 are preferably arranged corresponding to a position of an antinode P1 in the standing wave. This is because, when the active layers 17 and 22 are arranged corresponding to the position of the antinode P1, a gain of the light emitted from the active layers 17 and 22 may become large, and this is advantageous for laser oscillation. In this way, to arrange each of the active layers 17 and 22 corresponding to the position of the antinode P1 in the standing wave, it is necessary that the number of the antinodes P1 in the cavity layer 14 is equal to or larger than the number of the active layers 17 and 22. This means that the thickness of the cavity layer 14 (cavity length) is necessarily at least twice of the wavelength of the standing wave. At this time, as illustrated in FIG. 5, it is preferable that the p-type contact layer 19 and the n-type contact layer 20 be arranged corresponding to the position of a node P2 in the standing wave. Thereby, the ratio that the light emitted from the active layers 17 and 22 is absorbed in the p-type contact layer 19 and the n-type contact layer 20 may be reduced.

Figure 6:
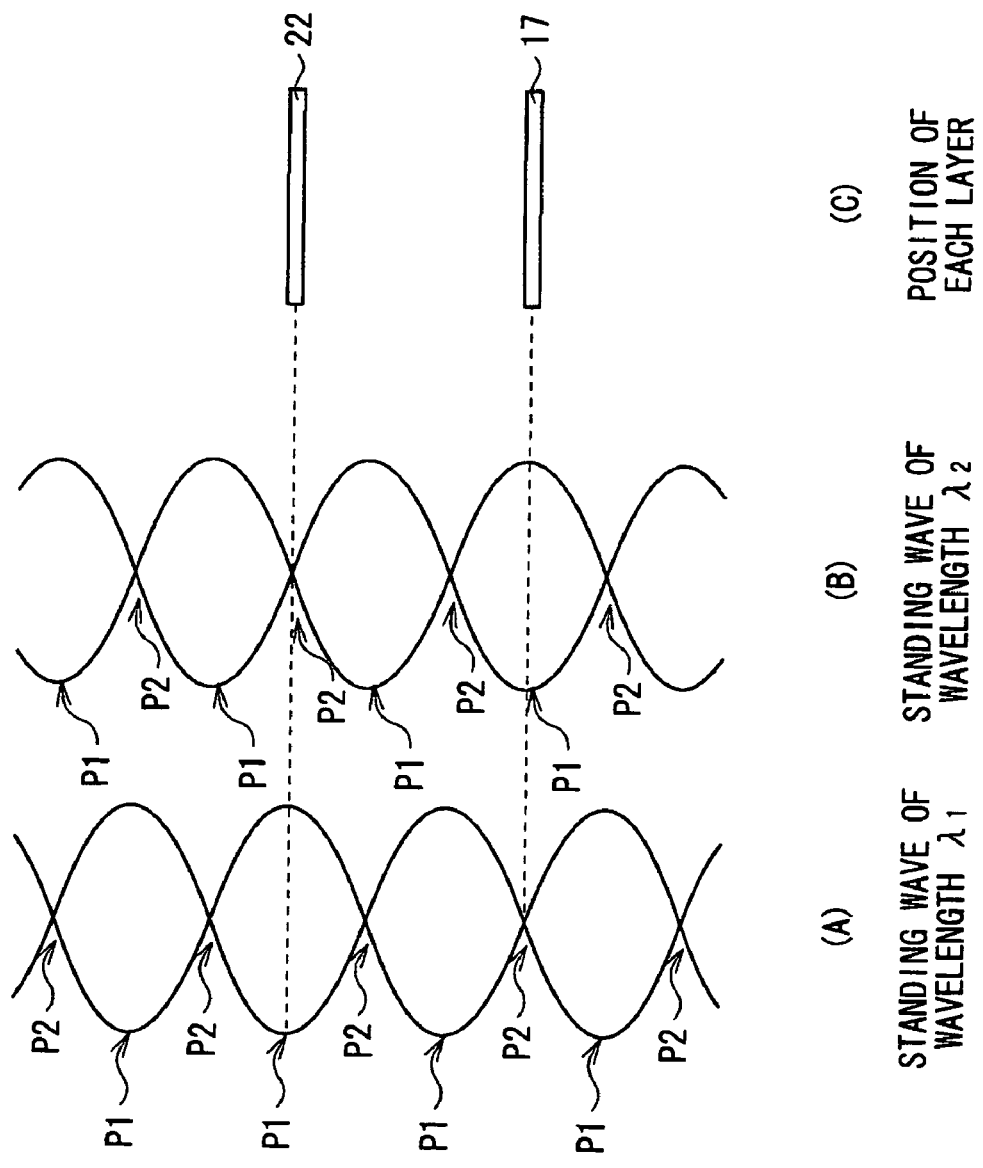
FIG. 6 is a schematic view for explaining another example of the positional relationship between the active layer and the standing wave of FIG. 1.

In the first embodiment, in the case where the active layers 17 and 22 have band gaps different from each other, for example, as illustrated in FIG. 6, a standing wave which has a wavelength $\lambda_1$ corresponding to the band gap of the active layer 22 and a standing wave which has a wavelength $\lambda_2$ corresponding to the band gap of the active layer 17 are generated and mixed in the stacked structure 11 (in the cavity layer 14). In that case, as illustrated in FIG. 6, it is preferable that the active layer 17 be arranged corresponding to the position of the antinode P1 in the standing wave which has the wavelength of $\lambda_2$, and corresponding to the position of the node P2 of the standing wave which has the wavelength of $\lambda_1$. Moreover, as illustrated in FIG. 6, it is preferable that the active layer 22 be arranged corresponding to the position of the antinode P1 in the standing wave which has the wavelength of $\lambda_1$, and corresponding to the position of the node P2 in the standing wave which has the wavelength of $\lambda_2$. Thereby, the ratio that the light emitted from the active layers 17 is absorbed in the active layer 22 may be reduced, and the ratio that the light emitted from the active layer 22 is absorbed in the active layer 17 may be reduced as well.

The n-type current confinement layer 24 is provided in the position of one low-refractive index layer on the active layer 17 side in the plurality of low-refractive index layers included in the n-type DBR layer 12, while replacing one low-refractive index layer. For example, as illustrated in FIG. 5, the n-type current confinement layer 24 is preferably arranged corresponding to the position of the node P2 in the standing wave which has the wavelength $\lambda_1$. Thereby, the ratio that the light traveling back and forth within the stacked structure 11 is scattered by the n-type current confinement layer 24 containing oxide may be reduced, and light loss of the light traveling back and forth within the stacked structure 11 may be minimized.

The n-type current confinement layer 24 includes a current confining region 24A in a region from the side face of the mesa 27 to a predetermined depth, and the region except that region (central region of the mesa 27) is a current injecting region 24B. The current injecting region 24B is made of, for example, n-type AlGaAs. The current confining region 24A is made of, for example, $Al_2O_3$ (aluminum oxide), and is obtained by oxidizing highly-concentrated Al contained in a layer to be oxidized 24D from the side face as will be described later. Therefore, the n-type current confinement layer 24 has a function for confining current.

The n-type current confinement layer 24 is formed in the mesa 27. The current confining region 24A has, for example, a ring plate shape about the central axis of the current injecting region 24B (central axis AX2 of the mesa 27). The diameter of the n-type current confinement layer 24 is appropriately adjusted according to oxidation speed, oxidation time, and the like in an oxidizing process so that an un-oxidized region (current injecting region 24B) having a predetermined dimension inside the mesa 27 remains in the oxidizing process which will be described later.

The p-type current confinement layer 25 is provided in the position of one low-refractive index layer on the active layer 22 side in the plurality of low-refractive index layers included in the p-type DBR layer 13, while replacing one low-refractive index layer. For example, as illustrated in FIG. 5, the p-type current confinement layer 25 is preferably arranged corresponding to the position of the node P2 in the standing wave which has the wavelength $\lambda_1$. Thereby, the ratio that the light traveling back and forth within the stacked structure 11 is scattered by the p-type current confinement layer 25 containing oxide may be reduced, and the light loss of the light traveling back and forth within the stacked structure 11 may be minimized.

The p-type current confinement layer 25 includes a current confining region 25A in the region from the side face of the mesa 26 to a predetermined depth, and the region except that region (central region of the mesa 26) is a current injecting region 25B. The current injecting region 25B is made of, for example, p-type AlGaAs. The current confining region 25A contains, for example, $Al_2O_3$ (aluminum oxide), and is obtained by oxidizing highly-concentrated Al contained in a layer to be oxidized 25D from the side face as will be described later. Therefore, the p-type current confinement layer 25 has a function for confining current.

The p-type current confinement layer 25 is formed in the mesa 26. The current confining region 25A has, for example, a ring plate shape about the central axis of the current injecting region 25B (central axis AX1 of the mesa 26). The diameter of the p-type current confinement layer 25 is appropriately adjusted according to oxidation rate, oxidation time, and the like in the oxidizing process so that an un-oxidized region (current injecting region 25B) having a predetermined dimension inside the mesa 26 remains in the oxidizing process which will be described later.

Figure 7:
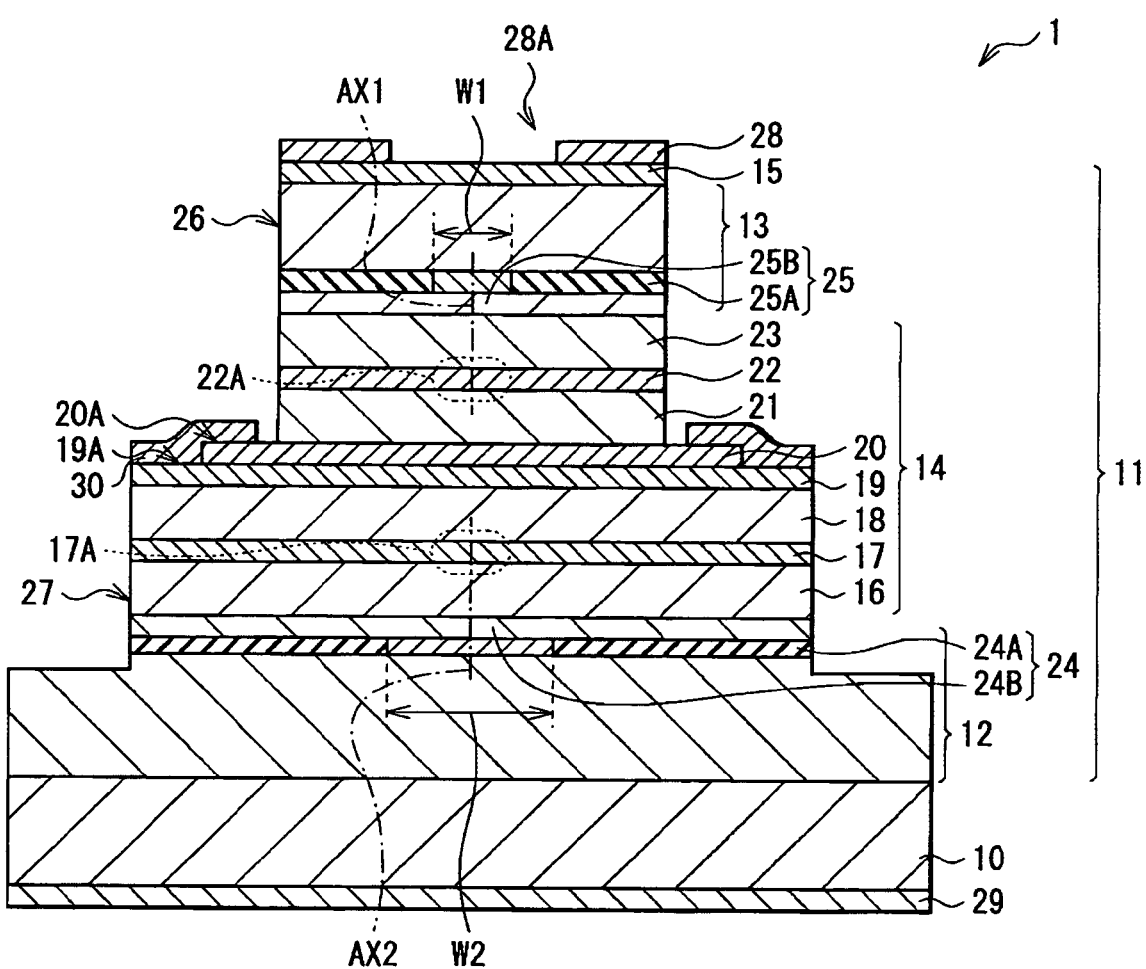
FIG. 7 is a cross-sectional view further illustrating still another example of the configuration in the direction A-A of the laser diode of FIG. 1.

Here, a diameter W2 of the current injecting layer 25B in the p-type current confinement layer 25 may be equal to a diameter W1 of the current injecting region 24B in the n-type current confinement layer 24, for example, as illustrated in FIGS. 2 to 4. The diameter W2 of the current injecting layer 25B in the p-type current confinement layer 25 may be different from the diameter W1 of the current injecting region 24B in the n-type current confinement layer 24, for example, as illustrated in FIG. 7.

In the first embodiment, on the upper surface of the mesa 26 (upper surface of the p-type contact layer 15), an annular p-side electrode 28 (second conductive section) having an aperture 28A in a region facing the current injecting regions 24B and 25B is provided. The p-type electrode 28 has, for example, the configuration in which titanium (Ti), platinum (Pt), and gold (Au) are stacked in this order from the upper surface of the mesa 26 side, and is electrically connected to the p-type contact layer 15. On the rear surface of the n-type semiconductor substrate 10, an n-side electrode 29 (first conductive section) is provided. The n-side electrode 29 has, for example, the configuration in which alloy of gold (Au) and germanium (Ge), nickel (Ni), and gold (Au) are stacked in this order from the n-type semiconductor substrate 10 side, and is electrically connected to the n-type semiconductor substrate 10.

In the first embodiment, a connecting section 30 (third conductive section) in contact with and electrically connected to the exposed face 19A of the p-type contact layer 19 and the exposed face 20A of the n-type contact layer 20 is provided. In the case where the diameter of the mesa 27 is approximately equal to that of the mesa 26, the connecting section 30 is formed in contact with the side faces of the p-type contact layer 19 and the n-type contact layer 20 (side face of the mesa 27). In the case where the diameter of the mesa 27 is larger than that of the mesa 26, the connecting section 30 is formed in contact with outer edges of the upper surfaces of the p-type contact layer 19 and the n-type contact layer 20 (bottom of the mesa 26).

Figure 8:
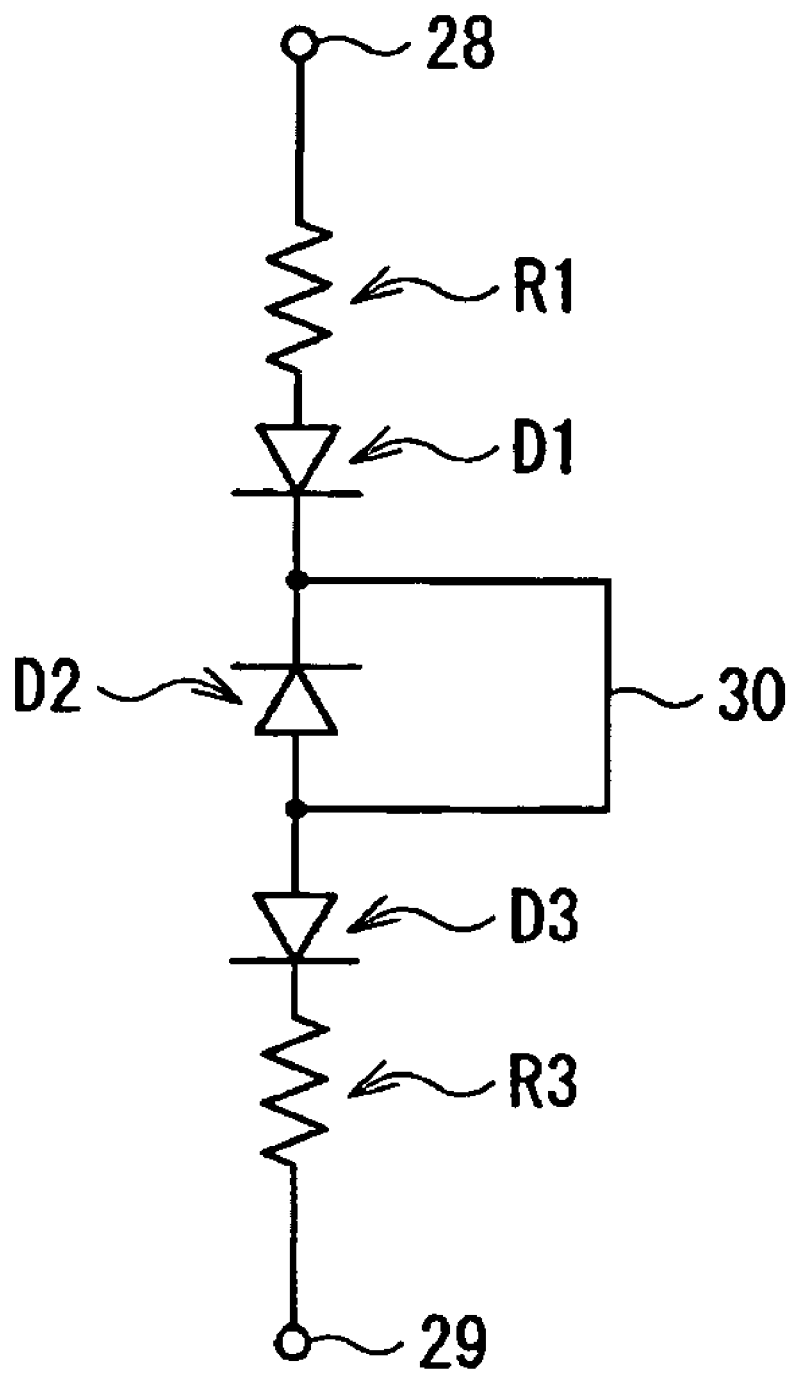
FIG. 8 is an equivalent circuit view of the laser diode of FIG. 1.

FIG. 8 illustrates an example of an equivalent circuit of the laser diode 1 according to the first embodiment. As illustrated in FIG. 8, the laser diode 1 is represented as a circuit composed of the p-side electrode 28, a diode D1 having the PIN structure formed in the mesa 26 and a resistance component R1, a diode D2 having the PN structure formed with the p-type contact layer 19 and the n-type contact layer 20, a diode D3 having the PIN structure formed in the mesa 27 and a resistance component R3, and the connecting section 30. The connecting section 30 electrically connected to both of the p-type contact layer 19 and the n-type contact layer 20 is connected in parallel to the diode D2. The diode D2 has a path connected in series to the n-side electrode 29.

In FIG. 8, the connecting section 30 connected in parallel to the diode D2 is a detour which allows the current to flow in a direction normally regarded as a reverse bias direction (direction from the n-type semiconductor layer side to the p-type semiconductor layer side when the n-type semiconductor layer and the p-type semiconductor layer are in contact with each other) in the relation with the diode D2. That is, since the diodes D1 and D3 are connected in series through the connecting section 30, it is possible that the current flows in series in the forward direction between the p-side electrode 28 and the n-side electrode 29, that is, to the diodes D1 and D3.

The laser diode 1 having such a configuration may be manufactured, for example, as will be described below.

FIGS. 9 to 12 illustrate an example of a method of manufacturing the laser diode 1 in the manufacturing process order. In FIGS. 9 to 12, the cross-sectional configuration of a device in the manufacturing process is illustrated. When manufacturing the laser diode 1, a GaAs compound semiconductor is formed on the n-type semiconductor substrate 10 made of n-type GaAs, for example, through the use of MOCVD (metal organic chemical vapor deposition) method. At this time, the material for the GaAs compound semiconductor is, for example, trimethylaluminum (TMA), trimethylgallium (TMG), or arsine ($AsH_3$). The material for donor impurities is, for example, hydrogen selenide ($H_2Se$). The material for acceptor impurities is, for example, dimethyl zinc (DMZn).

Figure 9:
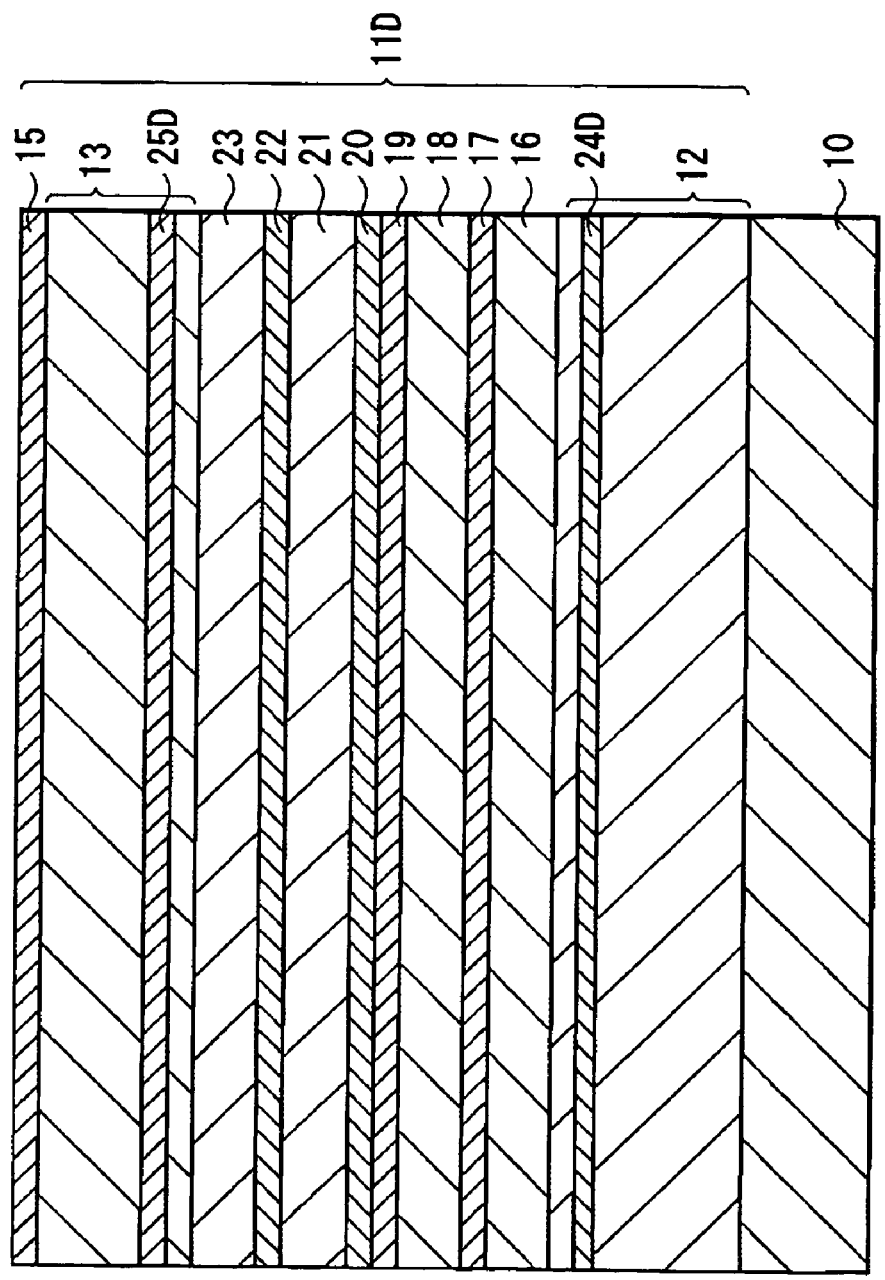
FIG. 9 is a cross-sectional view for explaining an example of a manufacturing process of the laser diode of FIG. 1.

First, the n-type DBR layer 12 including the layer to be oxidized 24D, the cavity layer 14, the p-type DBR layer 13 including the layer to be oxidized 25D, and the p-type contact layer 15 are stacked in this order on the n-type semiconductor substrate 10, and thereby a stacked structure 11D is formed (FIG. 9).

Figure 10:
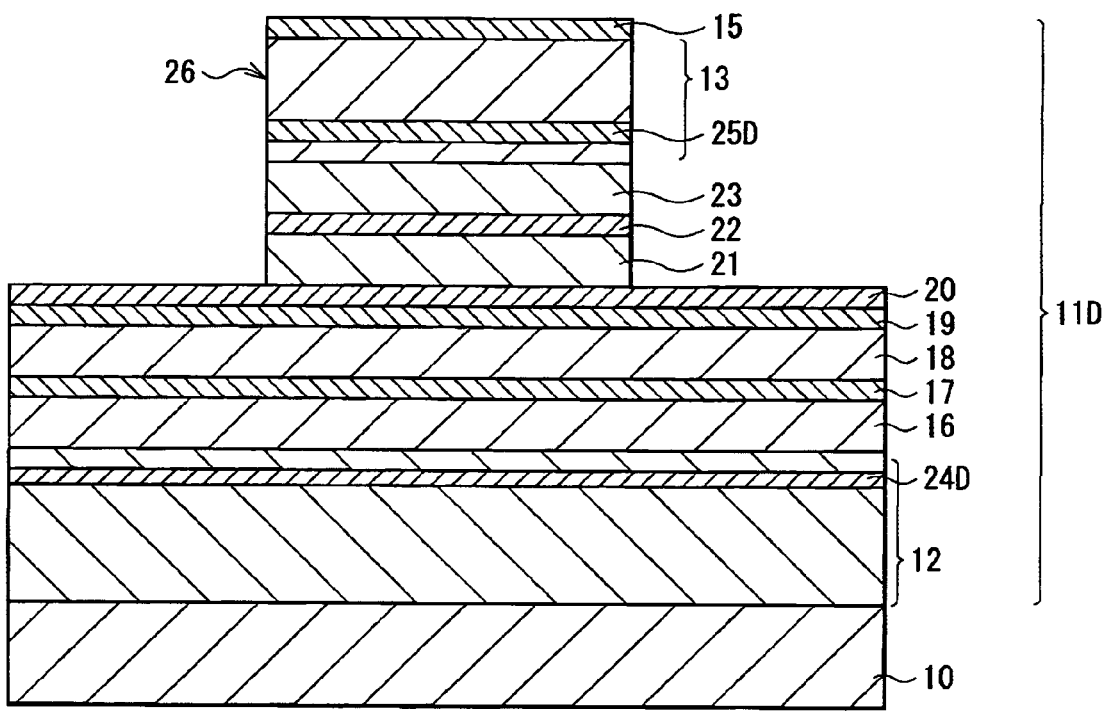
FIG. 10 is a cross-sectional view for explaining a step succeeding FIG. 9.

Next, a photoresist (not illustrated in the figure) is formed over the whole upper surface of the p-type contact layer 15. Then, by performing photolithography treatment and development, a circular resist layer (not illustrated in the figure) having a diameter equal to that of the mesa 26 is formed. Next, for example, with dry etching method, etching is selectively performed from the upper surface of the stacked structure 11D to the cladding layer 21 while using the resist layer as a mask. Thereby, the columnar mesa 26 is formed, and the n-type contact layer 20 is exposed to the bottom of the mesa 26 (FIG. 10).

Figure 11:
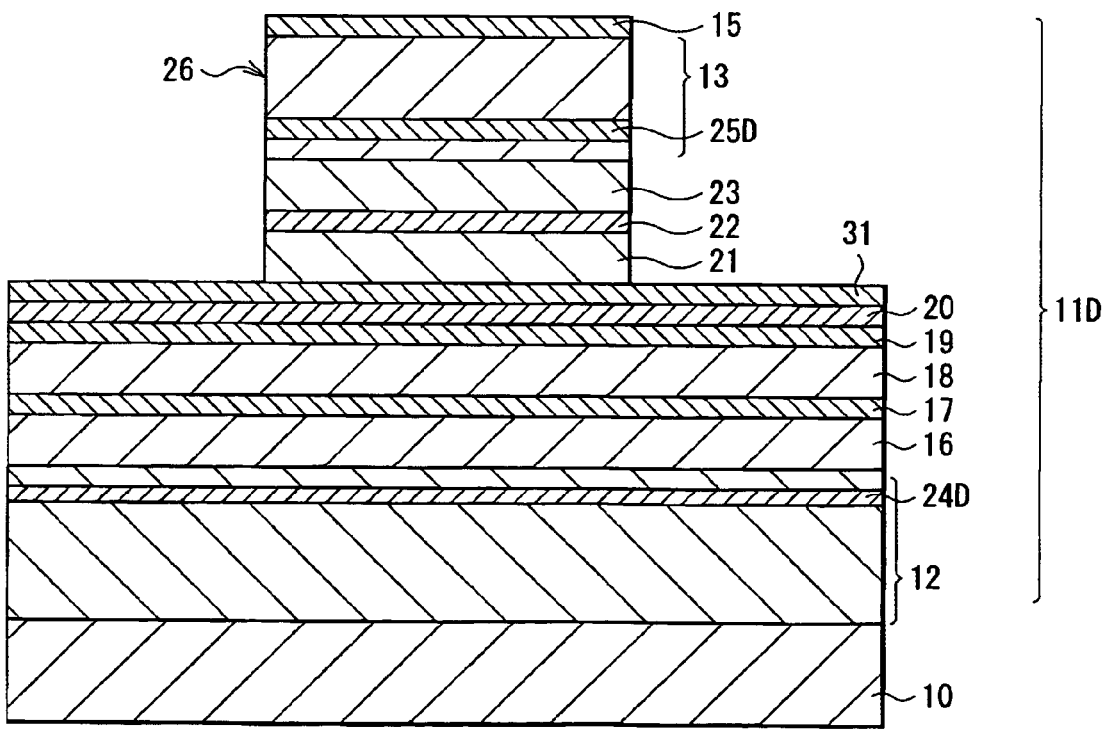
FIG. 11 is a cross-sectional view for explaining a step succeeding FIG. 10.

As illustrated in FIG. 11, it is also possible that the mesa 26 is formed as follows. An etching stop layer 31 is provided between the cladding layer 21 and the n-type contact layer 20 so that, when forming the mesa 26, etching is stopped with this etching stop layer 31. After that, the etching stop layer 31 is removed.

Figure 12:
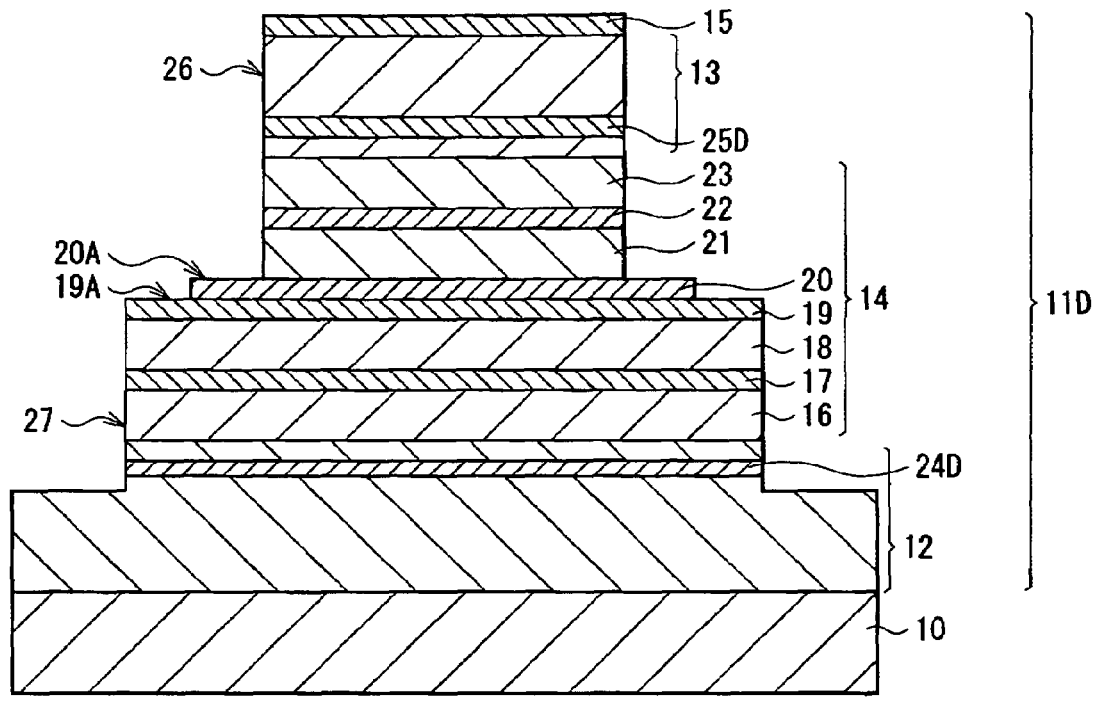
FIG. 12 is a cross-sectional view for explaining a step succeeding FIG. 11.
Figure 13:
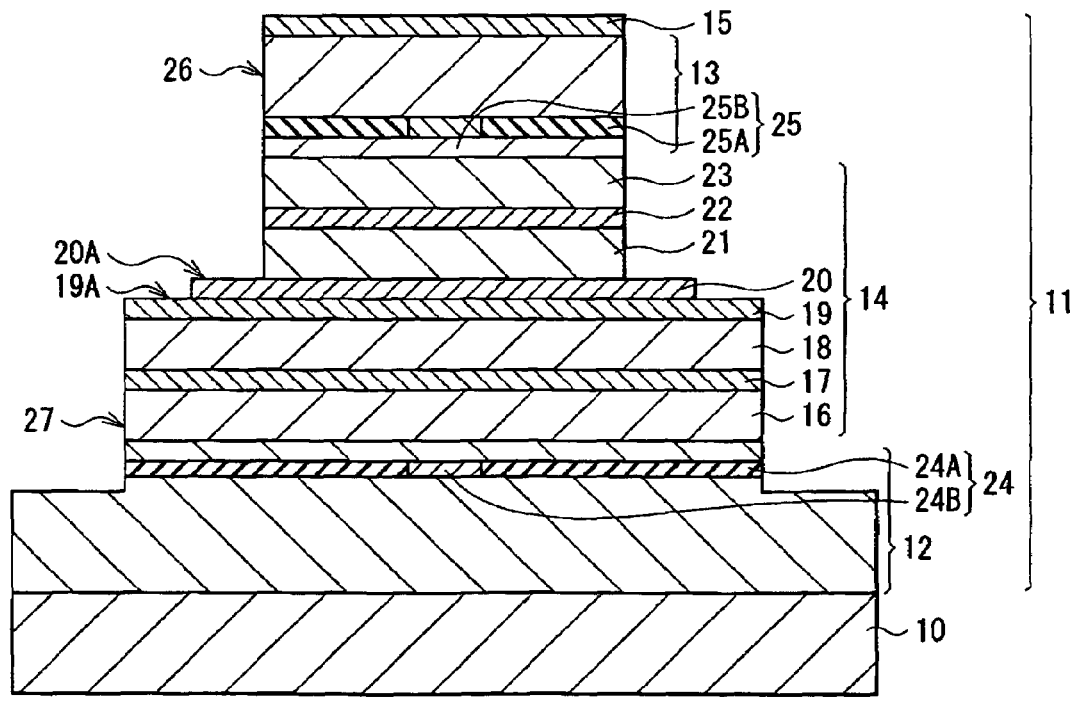
FIG. 13 is a cross-sectional view for explaining a step succeeding FIG. 12.

Next, a part exposed from the bottom of the mesa 26 in the n-type contact layer 20 is selectively etched, and thereby the p-type contact layer 19 is exposed. Then, etching is selectively performed from the upper surface of the p-type contact layer 19 to the upper part of the n-type DBR layer 12. Thereby, the columnar mesa 27 is formed, and the exposed face 19A of the p-type contact layer 19 and the exposed face 20A of the n-type contact layer 20 are formed in the outer edge of the upper surface of the mesa 27 (bottom of the mesa 26) (FIG. 12).

Next, the layers to be oxidized 24D and 25D are selectively oxidized from the side faces of the mesas 26 and 27, for example, with high-temperature oxidation treatment in a water-vapor atmosphere. Thereby, in the layers to be oxidized 24D and 25D, a region from the side face to a predetermined depth becomes an oxidized region (insulating region) containing aluminum oxide, which serves as the current confining regions 24A and 25A. A region further deep from the oxidized region becomes a non-oxidized region, which serves as the current injecting regions 24B and 25B. In this manner, the stacked structure 11D including the n-type current confinement layer 24 and the p-type current confinement layer 25 is formed.

Next, for example, with vacuum evaporation method, the annular p-side electrode 28 having the aperture 28A is formed on the p-type contact layer 15, the connecting section 30 is formed on the exposed faces 19A and 20A, and the n-side electrode 29 is formed on the rear surface of the n-type semiconductor substrate 10 (FIG. 2). In this manner, the laser diode 1 according to the first embodiment is manufactured.

Next, operations and effects of the laser diode 1 according to the first embodiment will be described.

In the laser diode 1 according to the first embodiment, when a predetermined voltage is applied between the p-side electrode 28 and the n-side electrode 29, current flows in series to the diodes D1 and D3 through the connecting section 30 connected in parallel to the diode D2, as illustrated in the equivalent circuit of FIG. 8. As a result, current is separately injected to the active layers 17 and 22 in the diodes D1 and D3 and thus light emission is produced by recombination of an electron and a hole. This light is reflected with the pair of n-type DBR layer 12 and the p-type DBR layer 13, and laser oscillation is generated with a predetermined wavelength. Then, the light as being a laser beam is emitted from the aperture 28A of the p-side electrode 28 to the outside.

In the laser diode 1 according to the first embodiment, the p-type contact layer 19 in the PIN structure formed with the n-type DBR layer 12, the n-type or undoped cladding layer 16, the undoped active layer 17, the p-type or undoped cladding layer 18, and the p-type contact layer 19, and the n-type contact layer 20 in the PIN structure formed with the n-type contact layer 20, the n-type or undoped cladding layer 21, the undoped active layer 22, the p-type or undoped cladding layer 23, and the p-type DBR layer 13 are electrically connected through the connecting section 30. Thereby, since current flows in a direction normally regarded as the reverse bias direction in the relation with the diode D2, it is possible that the diodes D1 and D3 (active layers 17 and 22) are electrically connected in series between the p-side electrode 28 and the n-side electrode 29. Therefore, since current is injected in series from the p-side electrode 28 and the n-side electrode 29 to the two active layers 17 and 22, it is possible that current with magnitude similar to each other flows to both of the active layers 17 and 22. As a result, even if the electric properties of each of the active layers 17 and 22 are varied, the current may be easily controlled with one driver.

Since the current separately flows to the two active layers 17 and 22 provided in the cavity layer 14, for example, as illustrated in FIGS. 2, 3, and 7, in the case where the central axis AX1 of the mesa 26 (central axis of the current injecting region 25B) and the central axis AX2 of the mesa 27 (central axis of the current injecting region 24B) overlap with each other, and the band gaps of the active layers 17 and 22 are equal to each other, the light output may increase while FFP is in stable condition. At this time, in the case where the band gaps of the active layers 17 and 22 are different from each other, one laser beam including two wavelengths is output.

Figure 14:
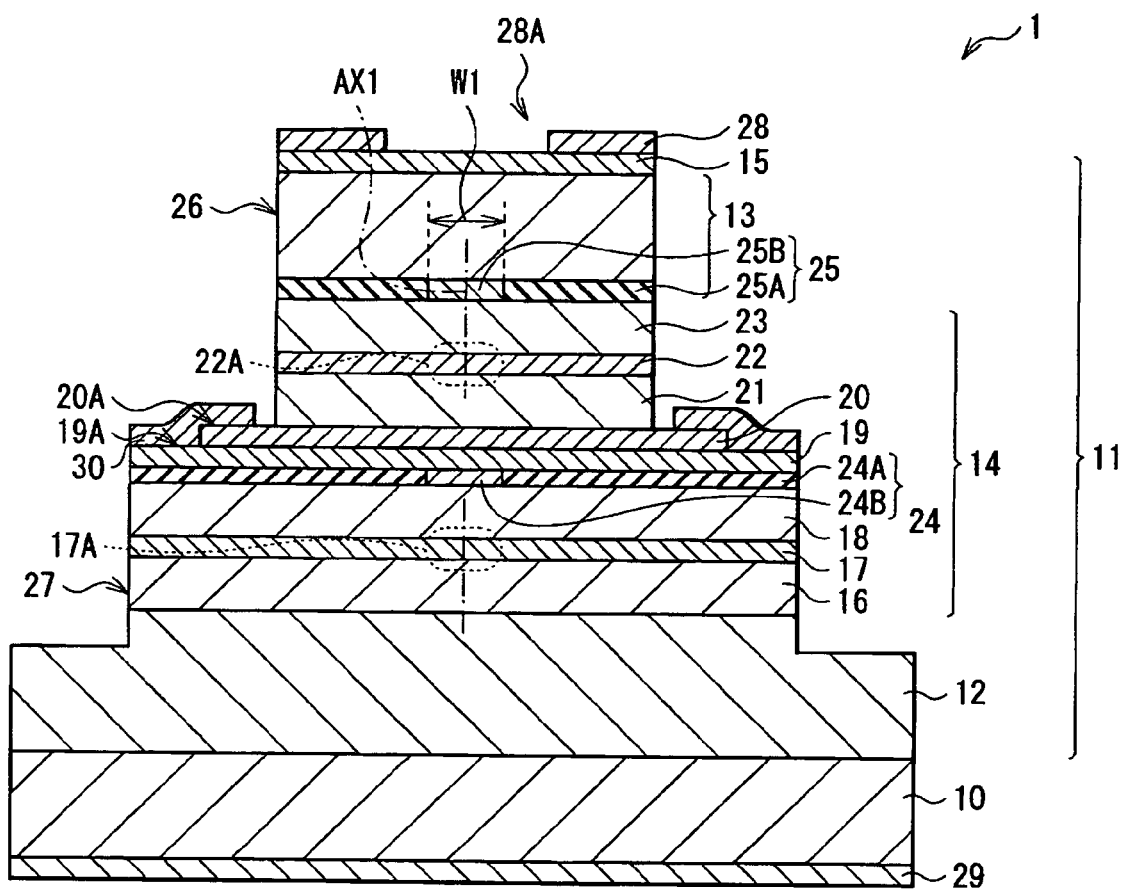
FIG. 14 is a cross-sectional view further illustrating still another example of the configuration in the direction A-A of the laser diode of FIG. 1.

In the first embodiment, since the n-type current confinement layer 24 and the p-type current confinement layer 25 are formed outside the cavity layer 14, the light confinement properties are superior, and the low threshold value is realized. To improve the current confinement properties, for example, as illustrated in FIG. 14, the n-type current confinement layer 24 may be formed on the p-side in the cavity layer 14 (between the p-type contact layer 19 and the cladding layer 18). However, in that case, the conductivity type of the n-type current confinement layer 24 is necessarily changed to the p-type.

In the first embodiment, for example, as illustrated in FIG. 4, in the case where the central axis AX1 of the mesa 26 (central axis of the current injecting region 25B) and the central axis AX2 of the mesa 27 (central axis of the current injecting region 24B) are shifted from each other, it is possible that two laser beams with identical wavelengths or wavelengths different from each other is output from the aperture 28A of the p-side electrode 28.

In the first embodiment, for example, as illustrated in FIGS. 2, 3, 4, and 7, in the case where the diameter of the mesa 27 is set larger than that of the mesa 26, and the connecting section 30 is provided on the exposed faces 19A and 20A arranged on the outer edge of the upper surface of the mesa 27 (bottom of the mesa 26), it is possible that the connecting section 30 is easily formed, for example, with evaporation method. As a result, there is no risk that a yield rate is reduced with the formation of the connecting section 30.

Modification

Figure 15:
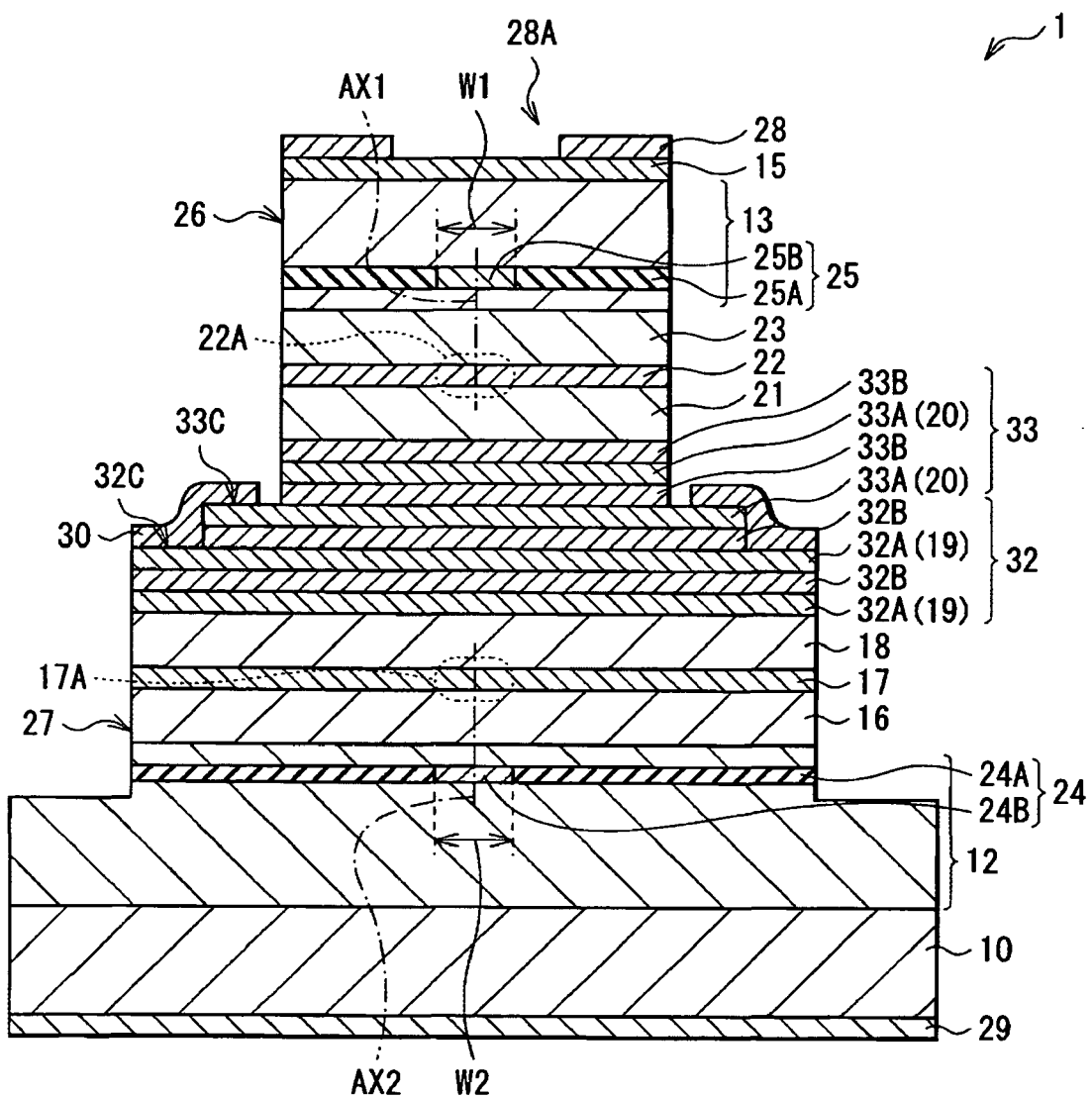
FIG. 15 is a cross-sectional view further illustrating still another example of the configuration in the direction A-A of the laser diode of FIG. 1.

In the first embodiment, although one p-type contact layer 19 and one n-type contact layer 20 are provided in the cavity layer 14, a plurality of p-type contact layers 19 and a plurality of n-type contact layers 20 may be provided. For example, as illustrated in FIG. 15, it is also possible that a p-type DBR layer 32 (third multilayer film reflecting mirror) by alternately stacking a low-refractive index layer 32A and a high-refractive index layer 32B, and an n-type DBR layer 33 (fourth multilayer film reflecting mirror) by alternately stacking a low-refractive index layer 33A and a high-refractive index layer 33B are provided in this order from a cladding layer 18 side between the cladding layer 18 and a cladding layer 21. Moreover, the p-type contact layer 19 is arranged in the position of the low-refractive index layer 32A, and the n-type contact layer 20 is arranged in the position of the low-refractive index layer 33A.

Second Embodiment

Figure 16:
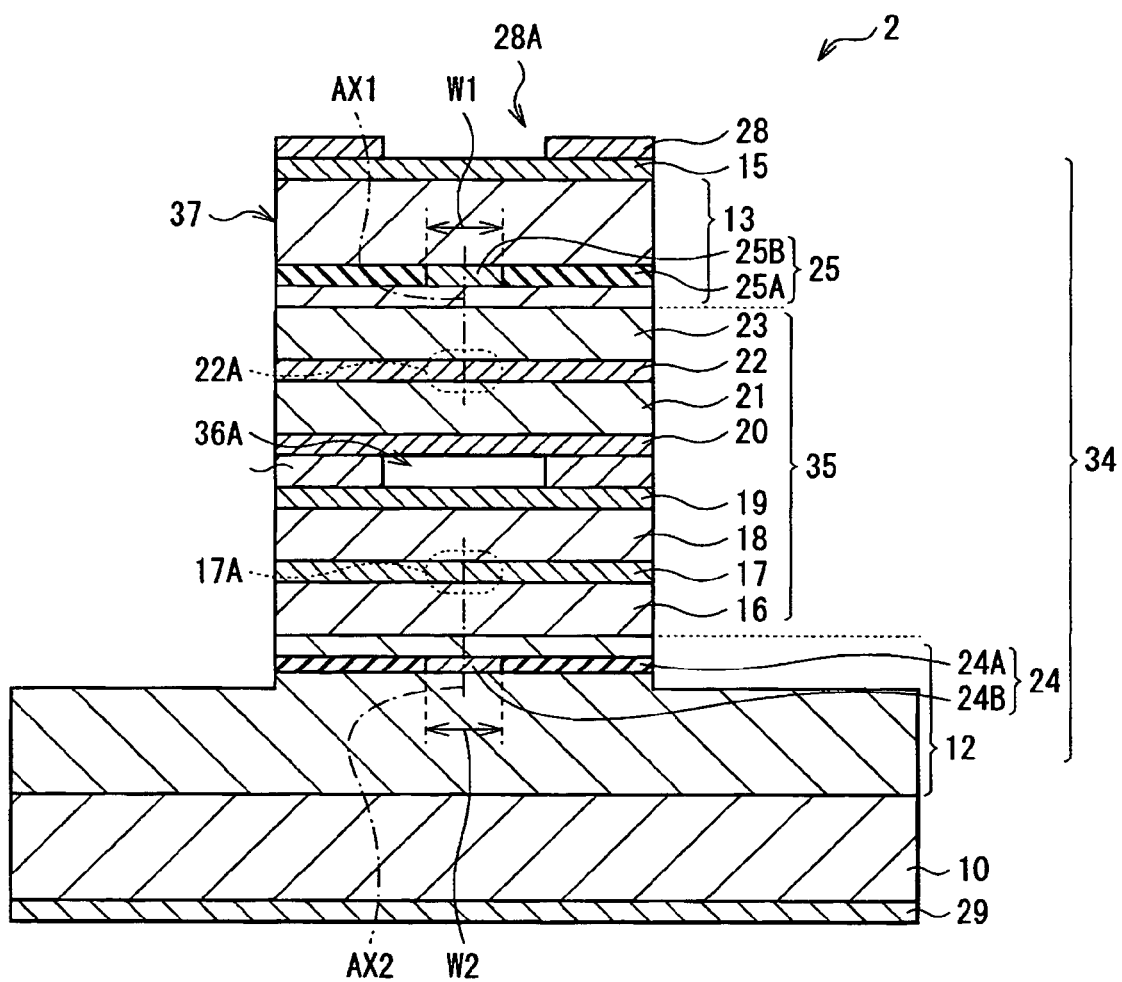
FIG. 16 is a cross-sectional view illustrating an example of the configuration of a laser diode according to a second embodiment of the present invention.

FIG. 16 illustrates the cross-sectional configuration of a laser diode 2 according to a second embodiment of the present invention. This laser diode 2 mainly differs from the laser diode 1 according to the first embodiment in that the laser diode 2 includes a connecting section 36 between a p-type contact layer 19 and an n-type contact layer 20, while the laser diode 1 includes the connecting section 30 on the exposed faces 19A and 20A of the p-type contact layer 19 and the n-type contact layer 20. Hereafter, differences from the first embodiment will be mainly described, and thereby points common to the first embodiment are appropriately omitted.

The laser diode 2 according to the second embodiment is a VCSEL which emits light in a stacking direction, and includes a stacked structure 34 on one surface side of an n-type semiconductor substrate 10. The stacked structure 34 includes a pair of resonator mirrors of an n-type DBR layer 12 on the n-type semiconductor substrate 10 side, and a p-type DBR layer 13 on the side opposite from the n-type semiconductor substrate 10. Between the n-type DBR layer 12 and the p-type DBR layer 13, a cavity layer 35 is provided. On the opposite side of the p-type DBR layer 13 from the n-type semiconductor substrate 10, a contact layer 15 is provided.

The cavity layer 35 has the configuration in which a cladding layer 16, an active layer 17, a cladding layer 18, the p-type contact layer 19, the connecting section 36, the n-type contact layer 20, a cladding layer 21, an active layer 22, and a cladding layer 23 are stacked in this order from the n-type DBR layer 12 side. An n-type current confinement layer 24 and a p-type current confinement layer 25 are provided outside the cavity layer 35. For example, as illustrated in FIG. 16, the n-type current confinement layer 24 is provided in the n-type DBR layer 12, and the p-type current confinement layer 25 is provided in the p-type DBR layer 13. Alternatively, for example, as illustrated in FIG. 17, the n-type current confinement layer 24 is provided between the n-type DBR layer 12 and the cladding layer 16, and the p-type current confinement layer 25 is provided between the p-type DBR layer 13 and the cladding layer 23.

In the upper part of the stacked structure 34, specifically, from the upper part of the n-type DBR layer 12 to the p-type contact layer 15, a columnar mesa 37 is formed. A side face (peripheral face) of the mesa 37 is a vertical face vertically (or almost vertically) intersecting the stacked face, and the side faces of the n-type current confinement layer 24 and the p-type current confinement layer 25 are exposed to the vertical face.

Figure 17:
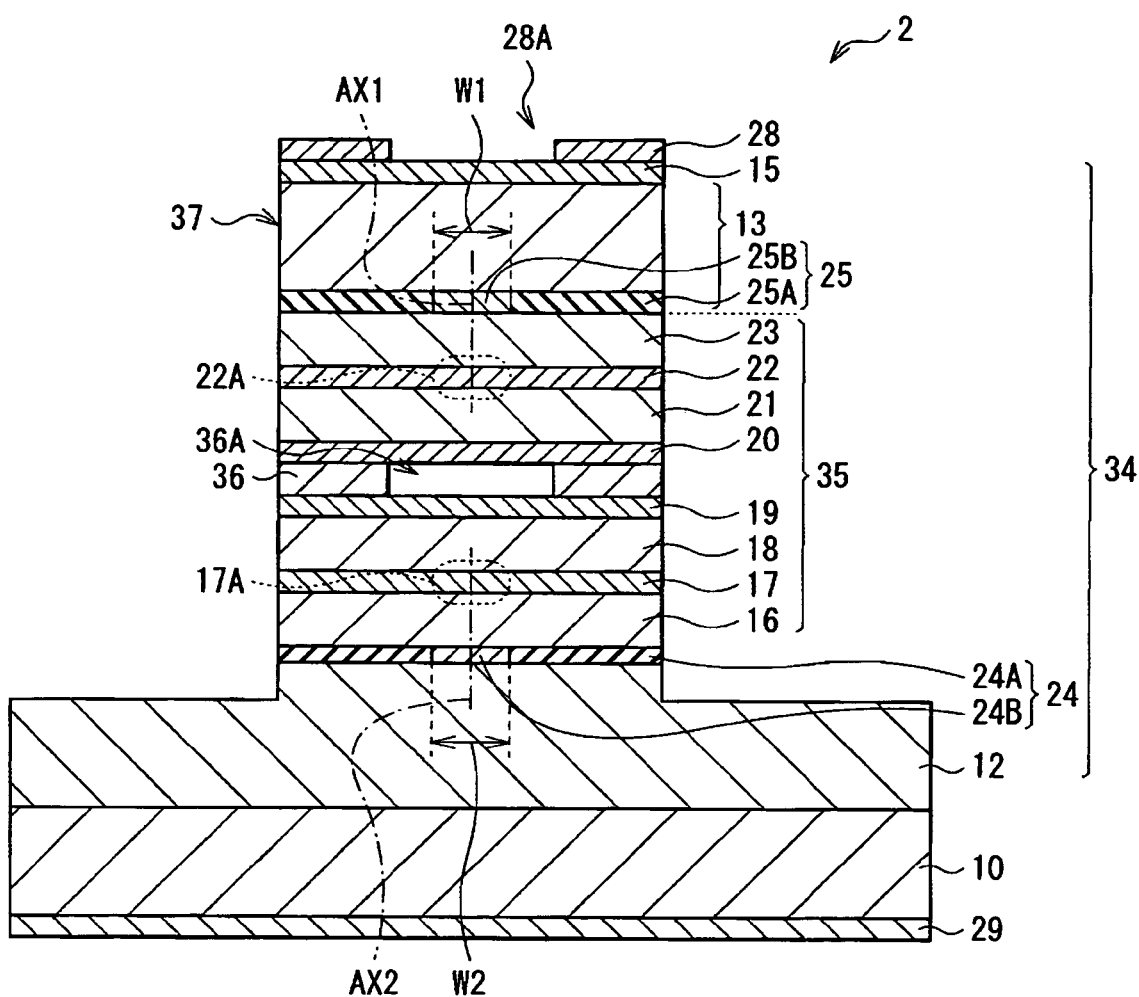
FIG. 17 is a cross-sectional view illustrating another example of the configuration of the laser diode of FIG. 16.

In the case where the number of light outputs (light emitting spots) from the laser diode 2 is one, as illustrated in FIGS. 16 and 17, it is preferable that the central axis AX2 of the current injecting region 24B in the n-type current confinement layer 24 overlap with the central axis AX1 of the current injecting region 25B in the p-type current confinement layer 25. In the case where the light output (light emitting spot) from the laser diode 2 is widened, or the number of light outputs is two, as illustrated in FIG. 18, a mesa 38 with a large mesa diameter is provided in the lower part including the n-type current confinement layer 24 in the cavity layer 35, and the central axis AX2 of the current injecting region 24B in the n-type current confinement layer 24 is shifted from the central axis AX1 of the current injecting region 25B in the p-type current confinement layer 25.

Figure 18:
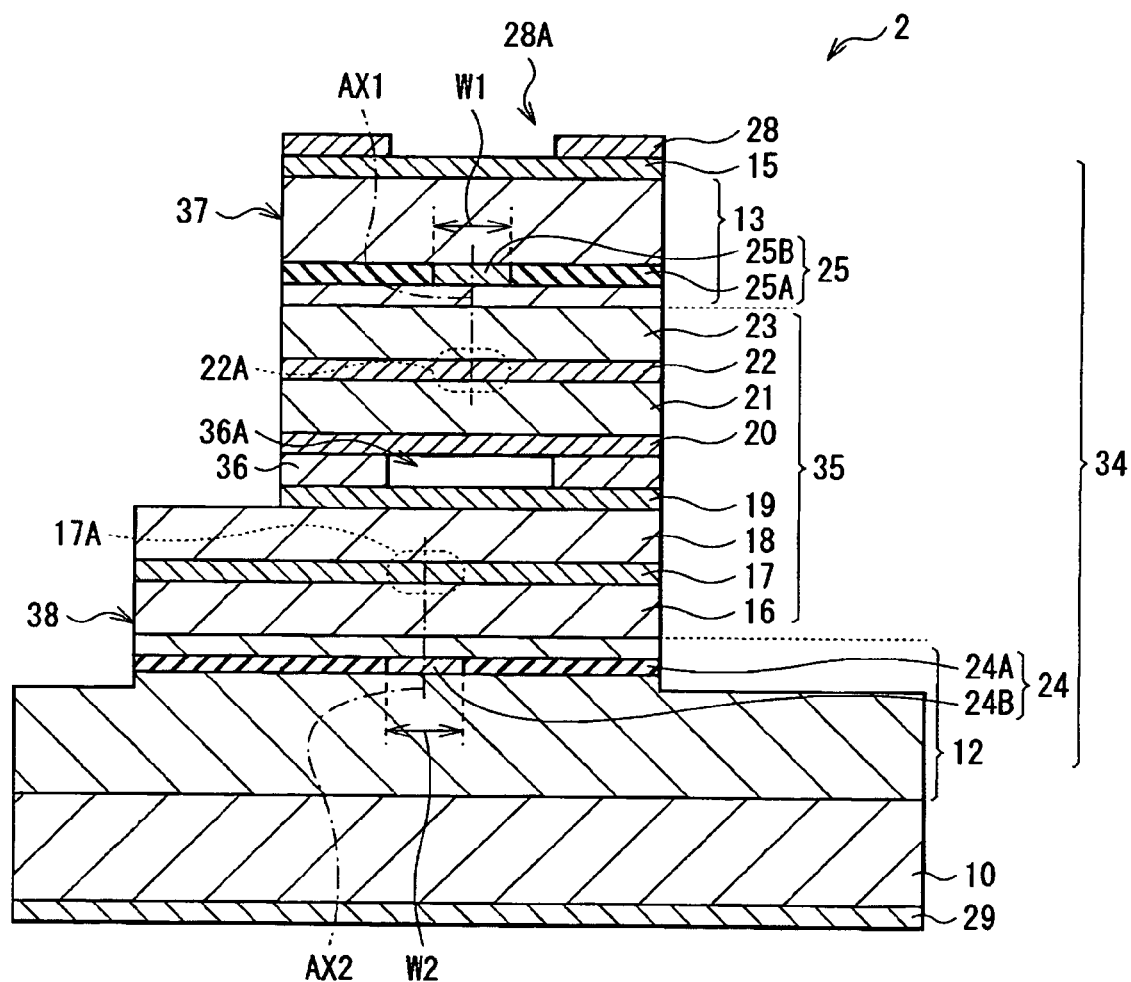
FIG. 18 is a cross-sectional view illustrating still another example of the configuration of the laser diode of FIG. 16.
Figure 19:
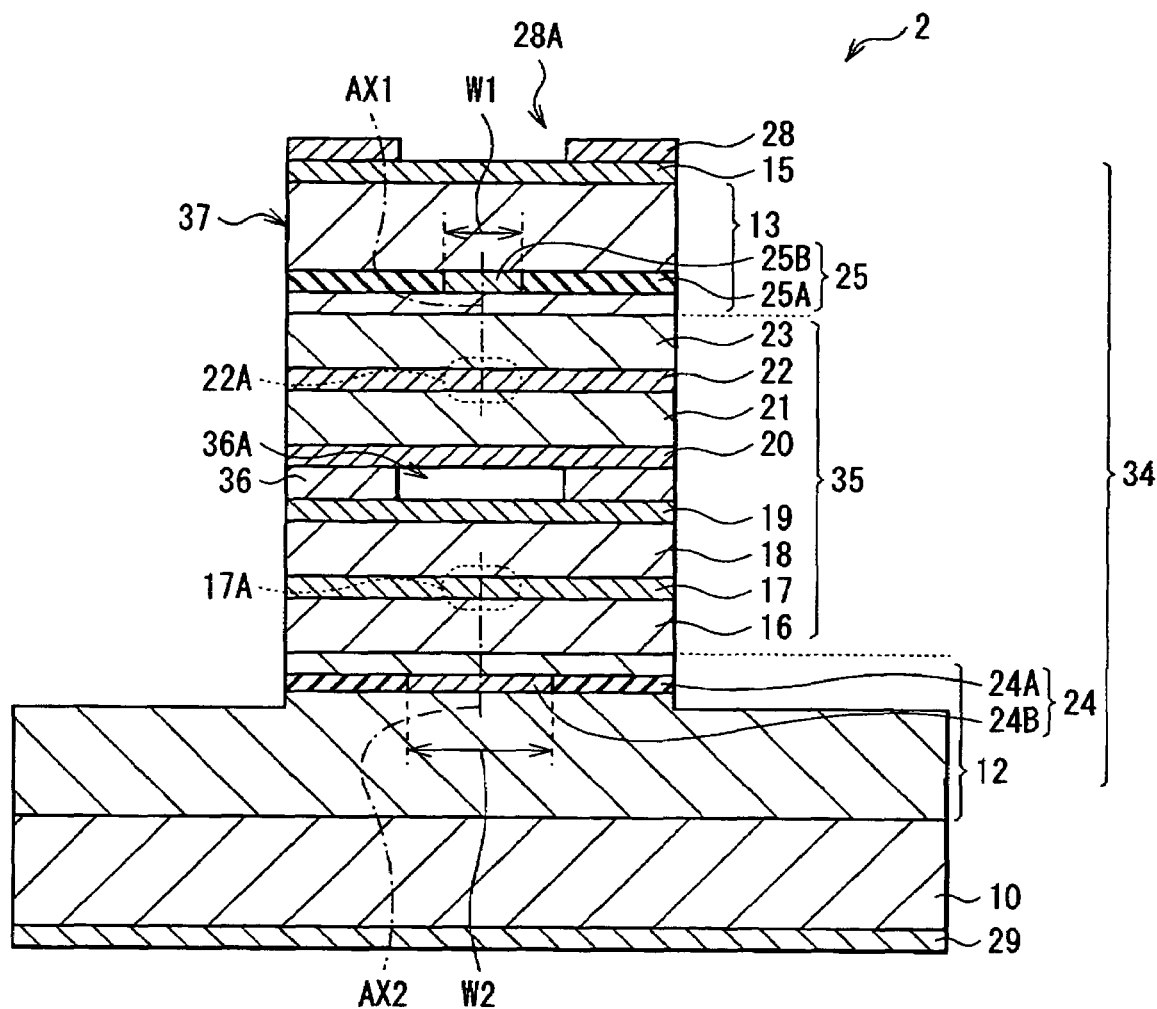
FIG. 19 is a cross-sectional view further illustrating still another example of the configuration of the laser diode of FIG. 16.

Here, a diameter W2 of the current injecting region 25B in the p-type current confinement layer 25 may be equal to a diameter W1 of the current injecting region 24B in the n-type current confinement layer 24, for example, as illustrated in FIGS. 16 to 18. Alternatively, the diameter W2 of the current injecting region 25B in the p-type current confinement layer 25 may be different from the diameter W1 of the current injecting region 24B in the n-type current confinement layer 24, for example, as illustrated in FIG. 19.

In the stacked structure 34, a PIN structure is formed with the n-type DBR layer 12, the cladding layer 16, the active layer 17, the cladding layer 18, and the p-type contact layer 19. Moreover, a PIN structure is formed with the n-type contact layer 20, the cladding layer 21, the active layer 22, the cladding layer 23, and the p-type DBR layer 13. That is, in the second embodiment, the two PIN structures are stacked in the stacked structure 34 (in the cavity layer 35), while an n-type semiconductor layer (n-type contact layer 20) in one of the PIN structures, and a p-type semiconductor layer (p-type contact layer 19) in the other of the PIN structures are brought into contact (stuck) with each other with the connecting section 36 in between.

In the second embodiment, on the upper surface of the mesa 37 (upper surface of the p-type contact layer 15), an annular p-side electrode 28 which includes an aperture 28A in a region facing the current injecting regions 24B and 25B is provided. On the rear surface of the n-type semiconductor substrate 10, an n-side electrode 29 is provided.

In the second embodiment, between the p-type contact layer 19 and the n-type contact layer 20, the connecting section 36 in contact with and electrically connected to the p-type contact layer 19 and the n-type contact layer 20 is provided. The connecting section 36 includes an aperture 36A in a region facing the current injecting region 24B and the current injecting region 25B. The aperture 36A is filled with, for example, air, or a conductive or insulating material.

Figure 20:
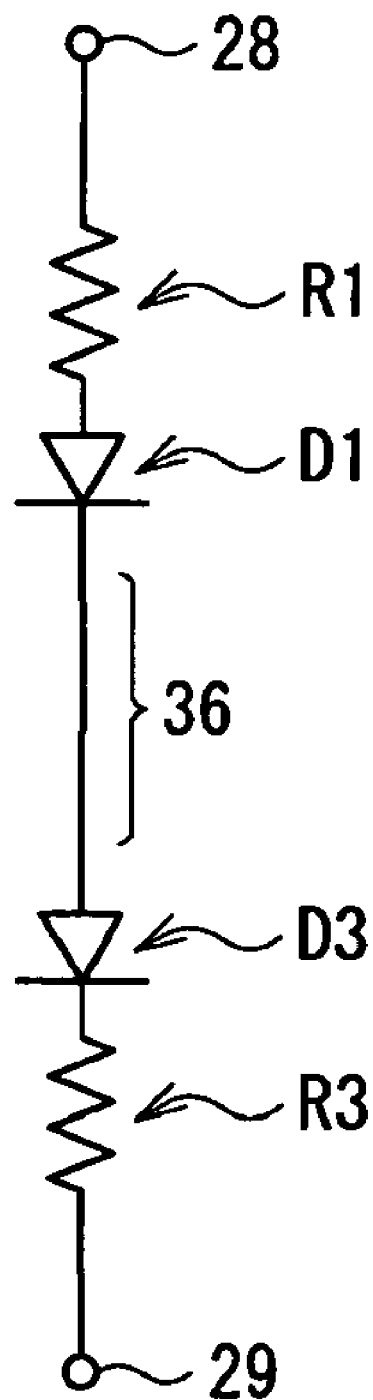
FIG. 20 is an equivalent circuit view of the laser diode of FIG. 16.

FIG. 20 illustrates an example of an equivalent circuit of the laser diode 2 according to the second embodiment. As illustrated in FIG. 20, the laser diode 2 is represented as a circuit composed of the p-side electrode 28, a diode D1 having the PIN structure formed in the mesa 26 and a resistance component R1, a diode D3 having the PIN structure formed in the mesa 27 and a resistance component R3, and the connecting section 36. The connecting section 36 electrically connected to both of the p-type contact layer 19 and the n-type contact layer 20 is connected in series between the diode D1 and the diode D3. The diode D1 and the diode D3 has a path connected in series to the n-side electrode 29.

In FIG. 20, the diodes D1 and D3 are connected in series through the connecting section 36. Thereby, it is possible that the current flows in series in the forward direction between the p-side electrode 28 and the n-side electrode 29, that is, to the diodes D1 and D3.

The laser diode 2 having such a configuration may be manufactured, for example, as will be described below.

FIGS. 21A to 21B, 22A to 22B, 23, 24, 25, and 26 illustrate an example of a method of manufacturing the laser diode 2 in the manufacturing process order. In FIGS. 21A to 21B, 22A to 22B, 23, 24, 25, and 26, the cross-sectional configuration of a device in the manufacturing process is illustrated. When manufacturing the laser diode 2, a GaAs compound semiconductor is formed on the n-type semiconductor substrate 10 made of n-type GaAs, and the p-type semiconductor substrate 38 made of p-type GaAs, for example, through the use of MOCVD method.

Figure 21A:
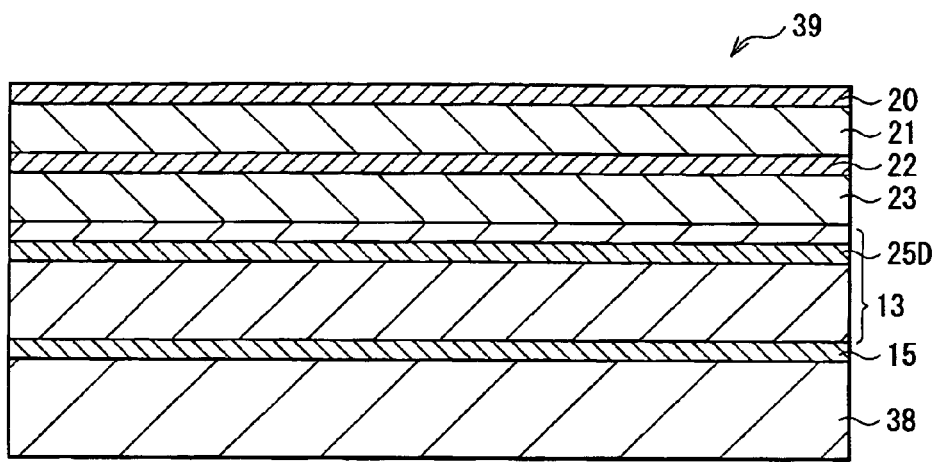
FIGS. 21A and 21B are cross-sectional views for explaining an example of a manufacturing process of the laser diode of FIG. 16.
Figure 21B:
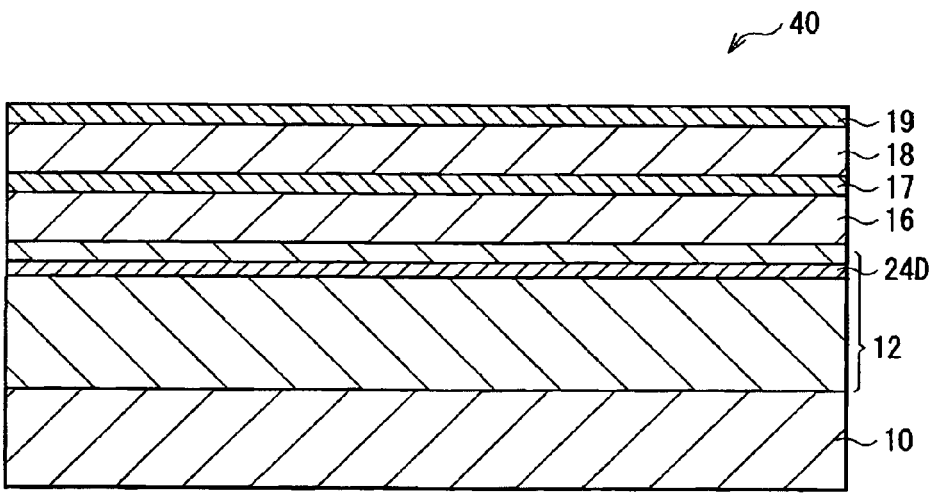

First, the p-type contact layer 15, the p-type DBR layer 13 including the layer to be oxidized 25D, the cladding layer 23, the active layer 22, the cladding layer 21, and the n-type contact layer 20 are stacked in this order on the p-type semiconductor substrate 38, and thereby a wafer 39 is formed (FIG. 21A). The n-type DBR layer 12 including the layer to be oxidized 24D, the cladding layer 16, the active layer 17, the cladding layer 18, and the p-type contact layer 19 are stacked in this order on the n-type semiconductor substrate 10, and thereby a wafer 40 is formed (FIG. 21B).

Figure 22A:
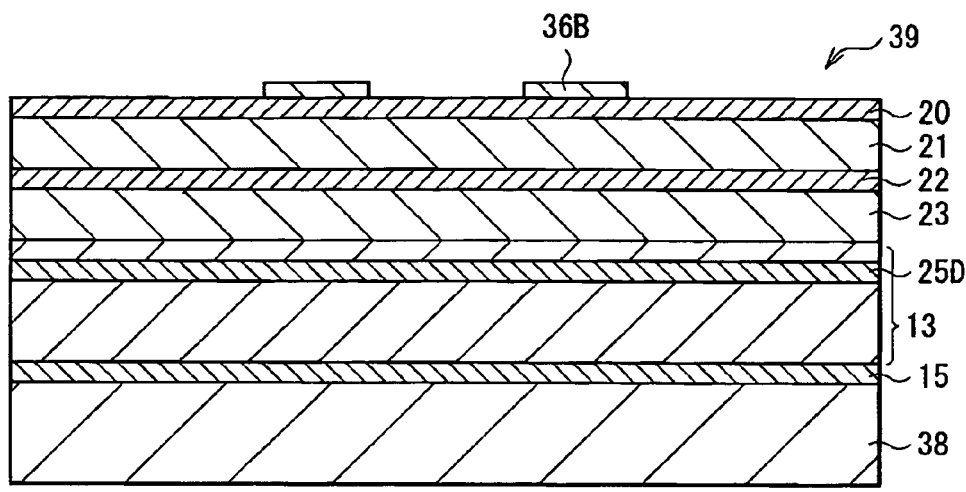
FIGS. 22A and 22B are cross-sectional views for explaining a step succeeding FIGS. 21A and 21B.
Figure 22B:
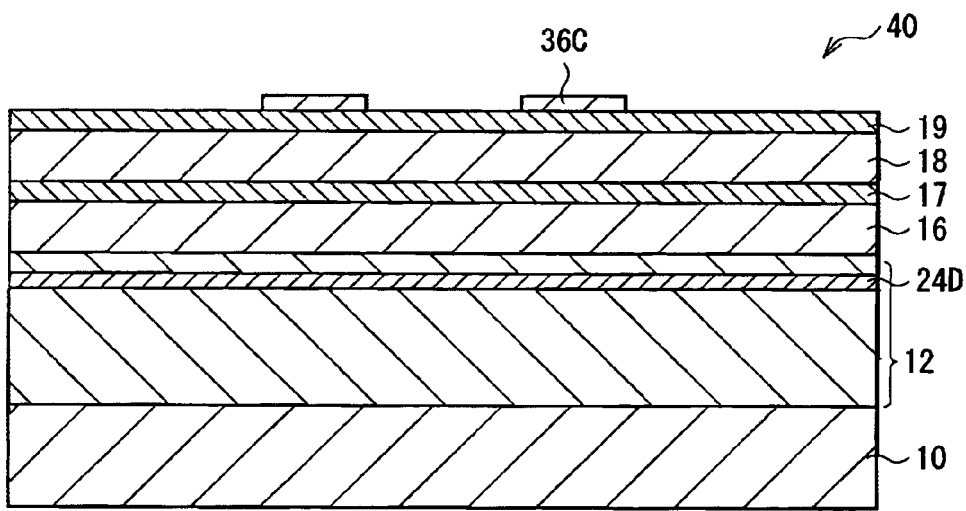
Figure 23:
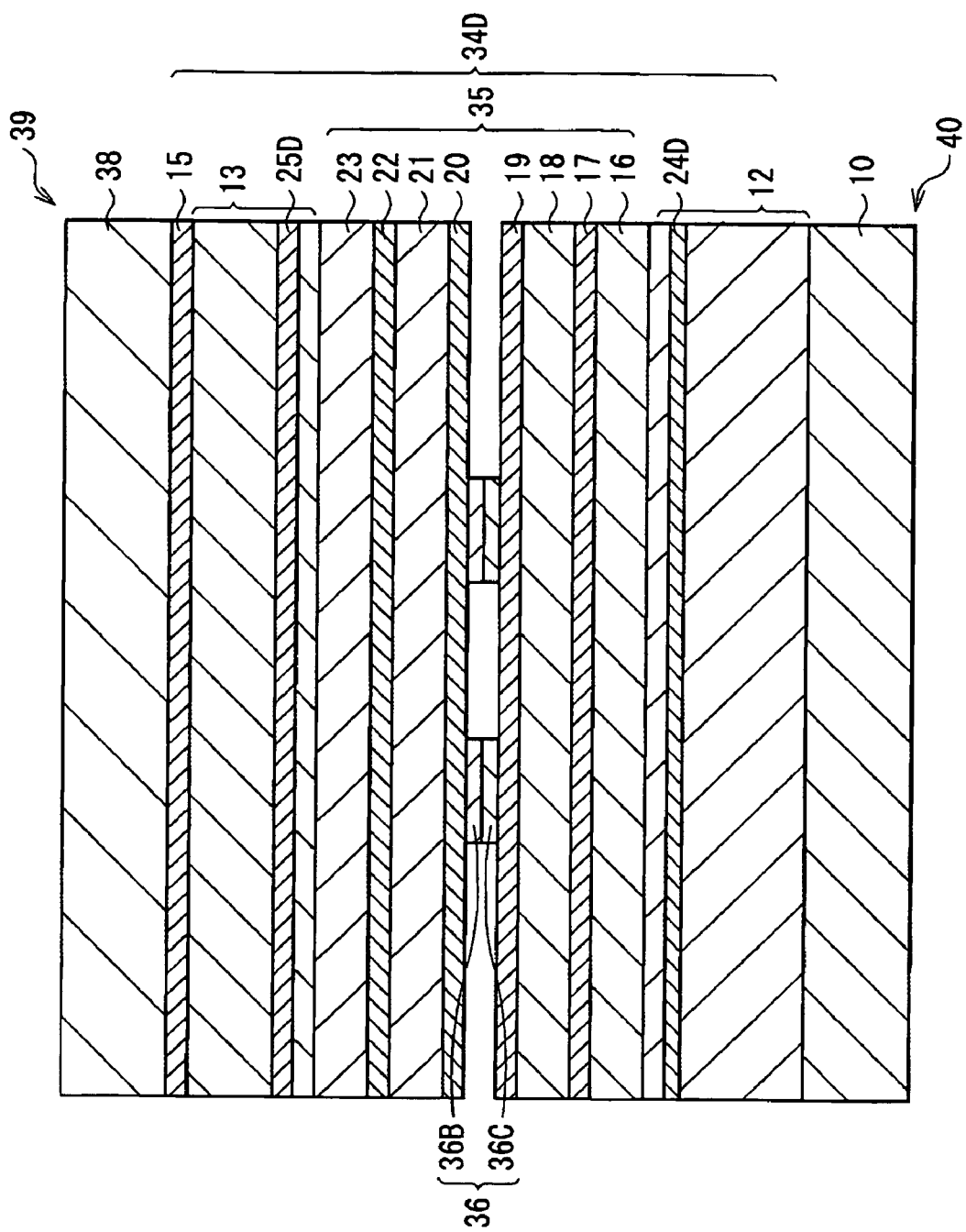
FIG. 23 is a cross-sectional view for explaining a step succeeding FIGS. 22A and 22B.

Next, a connecting section 36B is formed in a predetermined position on the surface of the wafer 39 (FIG. 22A). A connecting section 36C is formed in a predetermined position on the surface of the wafer 40 (FIG. 22A). The wafers 39 and 40 are stacked with each other while the connecting sections 36B and 36C face each other. Then, the connecting sections 36B and 36C are joined with each other. Thereby, the stacked structure 34D including the cavity layer 35 and the layers to be oxidized 24D and 25D is formed (FIG. 23).

Figure 24:
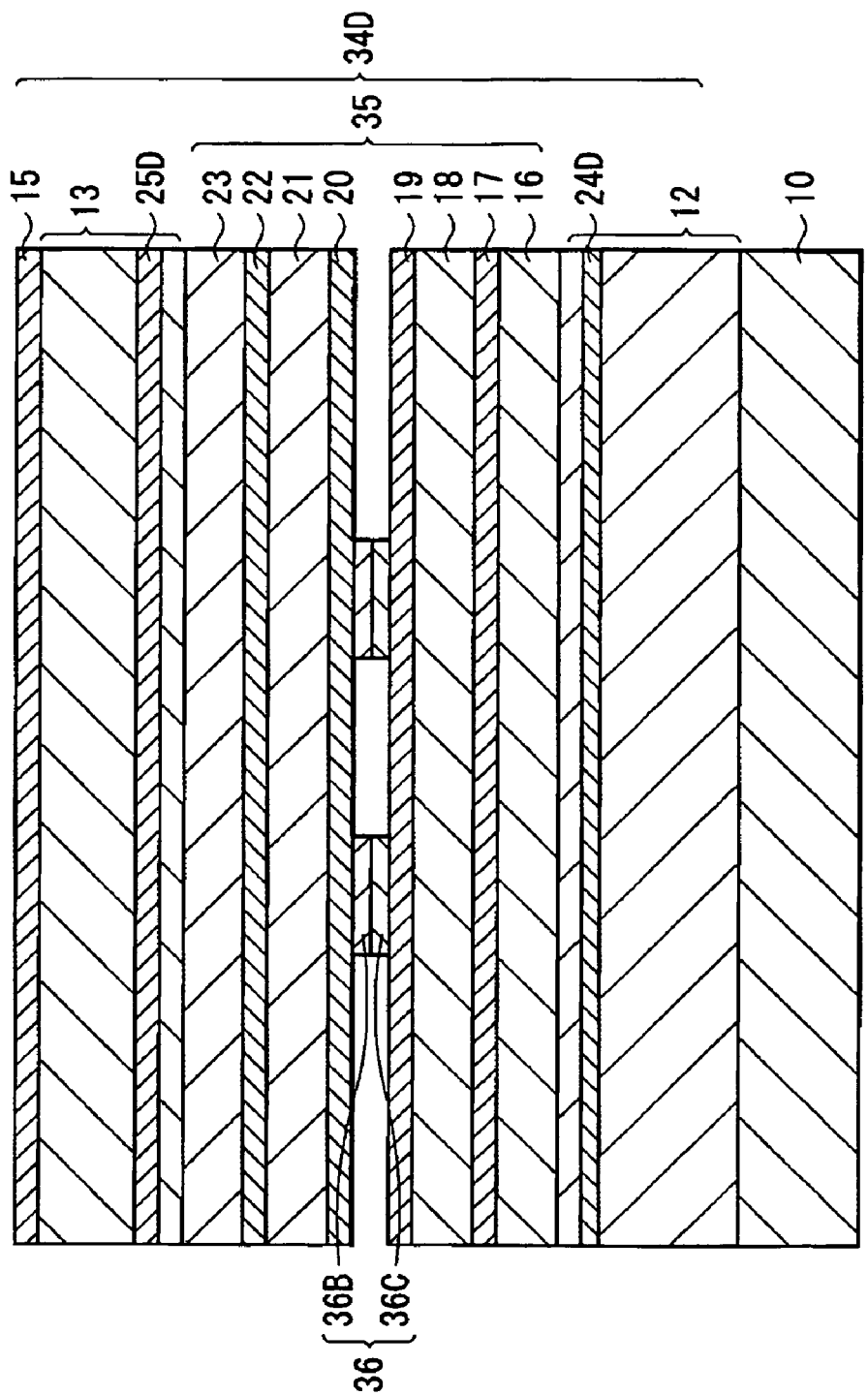
FIG. 24 is a cross-sectional view for explaining a step succeeding FIG. 23.
Figure 25:
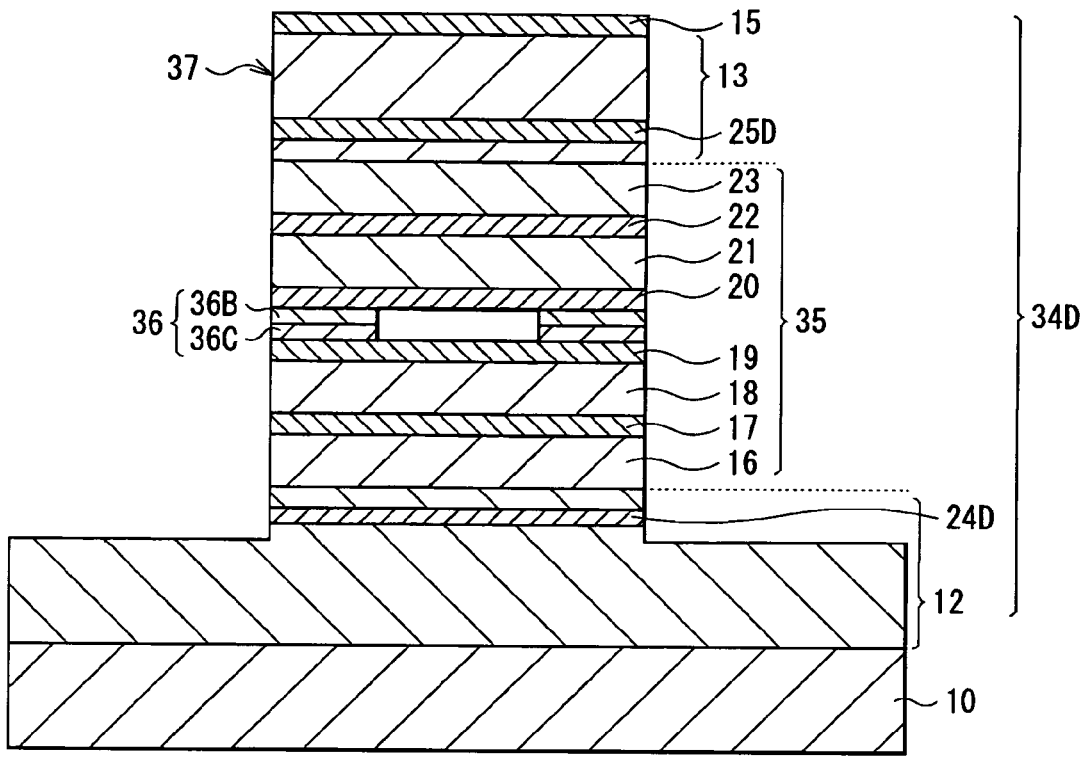
FIG. 25 is a cross-sectional view for explaining a step succeeding FIG. 24.

Next, the p-type semiconductor substrate 38 in the wafer 39 is removed, and the p-type contact layer 15 is exposed (FIG. 24). Then, etching is selectively performed from the upper surface of the p-type contact layer 15 to the upper part of the n-type DBR layer 12. Thereby, the columnar mesa 37 is formed (FIG. 25).

Figure 26:
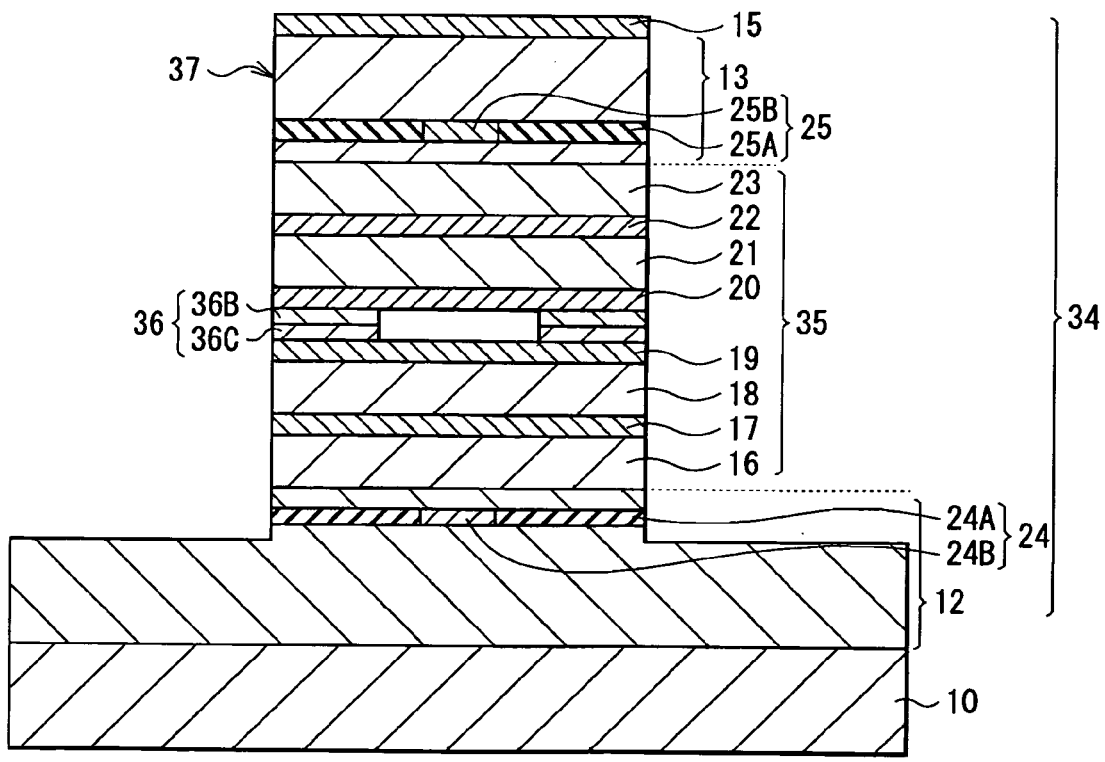
FIG. 26 is a cross-sectional view for explaining a step succeeding FIG. 25.

Next, the layers to be oxidized 24D and 25D are selectively oxidized from the side face of the mesa 37 with high-temperature oxidation treatment in a water-vapor atmosphere. Thereby, in the layers to be oxidized 24D and 25D, a region from the side face to a predetermined depth becomes an oxidized region (insulating region) containing aluminum oxide, which serves as the current confining regions 24A and 25A. A region further deep from the oxidized region becomes a non-oxidized region, which serves as the current injecting regions 24B and 25B. In this manner, the stacked structure 34 including the n-type current confinement layer 24 and the p-type current confinement layer 25 is formed (FIG. 26).

Next, for example, with vacuum evaporation method, the annular p-side electrode 28 including the aperture 28A is formed on the p-type contact layer 15, the connecting section 30 is formed on the exposed faces 19A and 20A, and the n-side electrode 29 is formed on the rear surface of the substrate 10 (FIG. 16). In this manner, the laser diode 2 according to the second embodiment is manufactured.

Next, operations and effects of the laser diode 2 according to the second embodiment will be described.

In the laser diode 2 according to the second embodiment, when a predetermined voltage is applied between the p-side electrode 28 and the n-side electrode 29, current flows in series to the diodes D1 and D3 through the connecting section 36 connected in series between the diode D1 and D3, as illustrated in the equivalent circuit of FIG. 20. As a result, current is separately injected to the active layers 17 and 22 in the diodes D1 and D3, and thus light emission is produced by recombination of an electron and a hole. This light is reflected with the pair of n-type DBR layer 12 and the p-type DBR layer 13, and laser oscillation is generated with a predetermined wavelength. Then, the light as being a laser beam is emitted from the aperture 28A of the p-side electrode 28 to the outside.

In the laser diode 2 according to the second embodiment, the p-type contact layer 19 in the PIN structure formed with the n-type DBR layer 12, the n-type or undoped cladding layer 16, the undoped active layer 17, the p-type or undoped cladding layer 18, and the p-type contact layer 19, and the n-type contact layer 20 in the PIN structure formed with the n-type contact layer 20, the n-type or undoped cladding layer 21, the undoped active layer 22, the p-type or undoped cladding layer 23, and the p-type DBR layer 13 are electrically connected with the connecting section 36 in between. Thereby, the diodes D1 and D2 (active layers 17 and 22) are electrically connected in series between the p-side electrode 28 and the n-side electrode 29. Therefore, since current is injected in series from the p-side electrode 28 and the n-side electrode 29 to the two active layers 17 and 22, it is possible that current with magnitude similar to each other flows to both of the active layers 17 and 22. As a result, even if the electric properties of each of the active layers 17 and 22 are varied, the current may be easily controlled with one driver.

Since the current separately flows to the two active layers 17 and 22 provided in the cavity layer 35, for example, as illustrated in FIGS. 16, 17, and 19, in the case where the central axis AX1 of the current injecting region 25B and the central axis AX2 of the current injecting region 24B are overlaps with each other, and the band gaps of the active layers 17 and 22 are equal to each other, the light output may increase while FFP is in stable condition. At this time, in the case where the band gaps of the active layers 17 and 22 are different from each other, one laser beam including two wavelengths is output.

Figure 27:
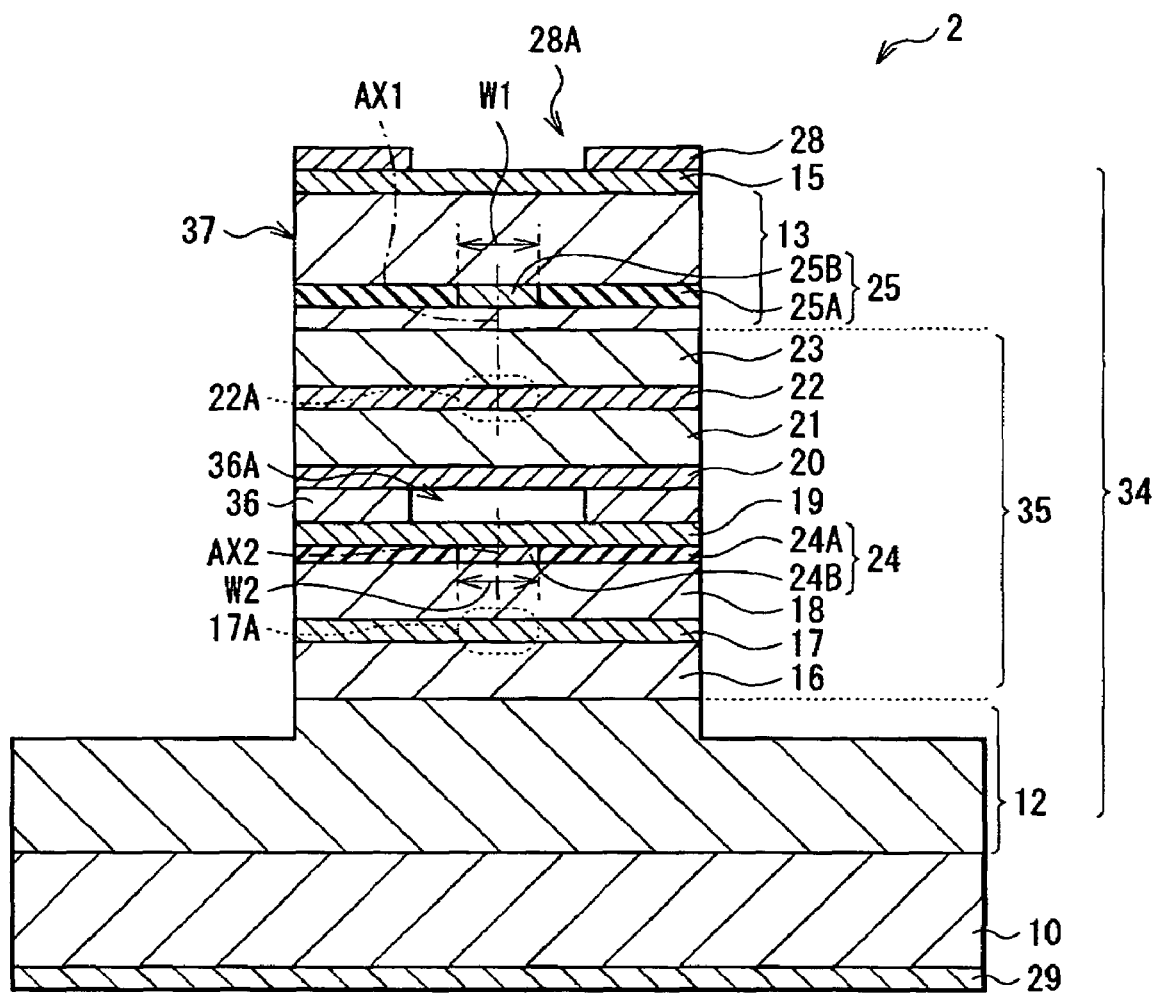
FIG. 27 is a cross-sectional view further illustrating still another example of the configuration of the laser diode of FIG. 16.

In the second embodiment, since the n-type current confinement layer 24 and the p-type current confinement layer 25 are formed outside the cavity layer 35, the light confinement properties are superior, and the low threshold value is realized. To improve the current confinement properties, for example, as illustrated in FIG. 27, the n-type current confinement layer 24 may be formed on the p-side in the cavity layer 14 (between the p-type contact layer 19 and the cladding layer 18). However, in that case, the conductivity type of the n-type current confinement layer 24 is necessarily changed to the p-type.

In the second embodiment, for example, as illustrated in FIG. 18, in the case where the central axis AX1 of the current injecting region 25B and the central axis AX2 of the current injecting region 24B are shifted from each other, it is possible that two laser beams with identical wavelengths or wavelengths different from each other is output.

Although the present invention is described with reference to the first and second embodiments and the modification, the invention is not limited to those, and various modifications may be made.

For example, although the p-type semiconductor substrate is used as the substrate for the laser diodes 1 and 2 in the first and second embodiments and the modification, the n-type semiconductor substrate may be used. In that case, however, the term "p-type" is replaced with "n-type", and the term "n-type" is replaced with "p-type" in the descriptions of each semiconductor layer in the first and second embodiments and the modification.

In the first and second embodiments and the modification, although the present invention is described with an example of the AlGaAs compound laser diode, the present invention is also applicable to other compound laser diodes such as GaInP, AlGaInP, InGaAs, GaInP, InP, GaN, GaInN, and GaInNAs compound laser diodes. Moreover, the present invention is applicable to not only a laser diode, but also a light emitting diode.

The present application contains subject matter related to that disclosed in Japanese Priority Patent Application JP 2008-126665 filed in the Japan Patent Office on May 14, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting device comprising:
   a first-conductivity-type first multilayer film reflecting mirror, and a second-conductivity-type second multilayer film reflecting mirror;
   a cavity layer arranged between the first multilayer film reflecting mirror and the second multilayer film reflecting mirror; and
   a first conductive section, a second conductive section, and a third conductive section used for current injection to the cavity layer,
   wherein the cavity layer has a stacked configuration including a first-conductivity-type or undoped first cladding layer, an undoped first active layer, a second-conductivity-type or undoped second cladding layer, a second-conductivity-type first contact layer, a first-conductivity-type second contact layer, a first-conductivity-type or undoped third cladding layer, an undoped second active layer, and a second-conductivity-type or undoped fourth cladding layer in this order from the first multilayer film reflecting mirror side,
   the first conductive section is electrically connected to the first multilayer film reflecting mirror,
   the second conductive section is electrically connected to the second multilayer film reflecting mirror, and
   the third conductive section is electrically connected to the first contact layer and the second contact layer,
   wherein the cavity layer has a column shape, and includes a first exposed face in which a part of an upper surface of the first contact layer is exposed from a side face of the cavity layer, and a second exposed face in which a part of an upper surface of the second contact layer is exposed from the side face of the cavity layer,
   wherein the third conductive section is formed over an upper surface of both of the first exposed face and the second exposed face, and
   wherein an etching stop layer is arranged between the second contact layer and the third cladding layer.

2. The semiconductor light emitting device according to claim 1, wherein the first active layer and the second active layer have band gaps equal to each other.

3. The semiconductor light emitting device according to claim 2, wherein both of the first active layer and the second active layer are arranged corresponding to a position of an antinode in a resonance mode generated in the cavity layer.

4. The semiconductor light emitting device according to claim 1, wherein the first active layer and the second active layer have band gaps different from each other.

5. The semiconductor light emitting device according to claim 4, wherein
- the first active layer is arranged corresponding to a position of an antinode in a resonance mode generated in the cavity layer by light emitted from the first active layer, and to a position of a node in a resonance mode generated in the cavity layer by light emitted from the second active layer, and
- the second active layer is arranged corresponding to a position of an antinode in the resonance mode generated in the cavity layer by the light emitted from the second active layer, and to a position of a node in the resonance mode generated in the cavity layer by the light emitted from the first active layer.

6. The semiconductor light emitting device according to claim 1 further comprising:
- a first-conductivity-type first current confinement layer arranged within the first multilayer film reflecting mirror, or between the first multilayer film reflecting mirror and the first cladding layer; and
- a second-conductivity-type second current confinement layer arranged within the second multilayer film reflecting mirror, or between the second multilayer film reflecting mirror and the fourth cladding layer.

7. The semiconductor light emitting device according to claim 1 further comprising:
- a second-conductivity-type first current confinement layer arranged between the second cladding layer and the first contact layer; and
- a second-conductivity-type first current confinement layer arranged within the second multilayer film reflecting mirror, or between the second multilayer film reflecting mirror and the fourth cladding layer.

8. The semiconductor light emitting device according to claim 6, wherein both of the first current confinement layer and the second current confinement layer include a current injecting region in a center in a stacked plane direction, and a current confining region in a periphery of the current injecting region in the stacked plane direction.

9. The semiconductor light emitting device according to claim 6, wherein a diameter of the current injecting region in the first current confinement layer and a diameter of the current injecting region in the second current confinement layer are equal to each other.

10. The semiconductor light emitting device according to claim 6, wherein the diameter of the current injecting region in the first current confinement layer and the diameter of the current injecting region in the second current confinement layer are different from each other.

11. The semiconductor light emitting device according to claim 6, wherein a central axis in the stacked plane direction of the current injecting region in the first current confinement layer and a central axis in the stacked plan direction of the current injecting region in the second current confinement layer overlap with each other.

12. The semiconductor light emitting device according to claim 6, wherein the central axis in the stacked plane direction of the current injecting region in the first current confinement layer and the central axis in the stacked plane direction of the current injecting region in the second current confinement layer are shifted from each other.

13. The semiconductor light emitting device according to claim 1, wherein the third conductive section is arranged between the first contact layer and the second contact layer.

14. The semiconductor light emitting device according to claim 1, wherein the cavity layer is formed by stacking a first stacked structure and a second stacked structure with each other with the third conductive section in between, the first stacked structure including the first multilayer film reflecting mirror, the first cladding layer, the first active layer, the second cladding layer, and the first contact layer in this order, and the second staked structure including the second contact layer, the third cladding layer, the second active layer, and the fourth cladding layer in this order.

15. The semiconductor light emitting device according to claim 1, wherein the cavity layer includes a third multilayer film reflecting mirror between the second cladding layer and the third cladding layer, and
- the first contact layer and the second contact layer are formed within the third multilayer film reflecting mirror.

16. The semiconductor light emitting device according to claim 15, wherein
- the cavity layer includes a plurality of first contact layers and a plurality of second contact layers, and
- the plurality of first contact layers and the plurality of second contact layers are formed within the third multilayer film reflecting mirror.

17. The semiconductor light emitting device according to claim 1, wherein the first conductive section is a first-conductivity-type-side electrode, the second conductive section being a second-conductivity-type-side electrode.

18. The semiconductor light emitting device according to claim 1, wherein the first contact layer and the second contact layer are electrically connected through the third conductive section.

* * * * *